US008436656B2

(12) United States Patent
Gitlin et al.

(10) Patent No.: US 8,436,656 B2
(45) Date of Patent: May 7, 2013

(54) METHOD AND APPARATUS FOR SAVING POWER IN AN INTEGRATED CIRCUIT

(75) Inventors: Daniel Gitlin, Palo Alto, CA (US); Martin Voogel, Los Altos, CA (US); Jason Redgrave, Mountain View, CA (US); Matt Crowley, San Jose, CA (US)

(73) Assignee: Tabula, Inc., Santa Clara, CA (US)

( * ) Notice: Subject to any disclaimer, the term of this patent is extended or adjusted under 35 U.S.C. 154(b) by 0 days.

(21) Appl. No.: 13/127,473

(22) PCT Filed: Jan. 7, 2009

(86) PCT No.: PCT/US2009/030364
§ 371 (c)(1),
(2), (4) Date: May 3, 2011

(87) PCT Pub. No.: WO2010/053590
PCT Pub. Date: May 14, 2010

(65) Prior Publication Data
US 2011/0267103 A1 Nov. 3, 2011

Related U.S. Application Data

(60) Provisional application No. 61/111,716, filed on Nov. 5, 2008.

(51) Int. Cl.
*H03K 19/0175* (2006.01)
(52) U.S. Cl.
USPC .................. 326/80; 326/68; 326/81; 326/86; 326/87; 327/333

(58) Field of Classification Search .............. 326/62–63, 326/68, 80–87; 327/333
See application file for complete search history.

(56) References Cited

U.S. PATENT DOCUMENTS

| 5,270,581 | A | 12/1993 | Nakamura |
| 6,130,550 | A | 10/2000 | Zaliznyak et al. |
| 6,344,758 | B1 | 2/2002 | Turner et al. |
| 7,310,003 | B2 | 12/2007 | Hutchings et al. |
| 7,714,612 | B1 * | 5/2010 | Pertijs .............................. 326/62 |
| 2008/0042723 | A1 * | 2/2008 | Chou et al. .................... 327/333 |

FOREIGN PATENT DOCUMENTS
WO   WO 2010/053590   5/2010

OTHER PUBLICATIONS

International Search Report for PCT/US2009/030364, Aug. 3, 2009 (mailing date), Tabula, Inc.
International Preliminary Report on Patentability for PCT/US2009/030364, May 19, 2011 (mailing date), Tabula, Inc.
Written Opinion for PCT/US2009/030364, Aug. 3, 2009 (mailing date), Tabula, Inc.

* cited by examiner

*Primary Examiner* — Jany Tran
(74) *Attorney, Agent, or Firm* — Adeli & Tollen LLP

(57) ABSTRACT

Some embodiments provide an integrated circuit ('IC') that includes at least first and second circuits operating at a first voltage. The IC includes, between the first and second circuits, a direct connection comprising a third circuit for transmitting a signal from the first circuit to the second circuit at a second voltage that is lower than the first voltage. At least one of the first and second circuits is a configurable circuit for configurably performing operations.

19 Claims, 28 Drawing Sheets

METHOD AND APPARATUS FOR SAVING POWER IN AN INTEGRATED CIRCUIT

CLAIM OF BENEFIT TO PRIOR APPLICATIONS

This application is a national stage application of PCT Application PCT/US2009/030364, entitled "Method and Apparatus for Saving Power in an Integrated Circuit," filed on Jan. 7, 2009, now published as WO 2010/053590. PCT Application PCT/US2009/030364 claims the benefit of U.S. Provisional Patent Application 61/111,716, entitled "Method and Apparatus for Saving Power in an Integrated Circuit," filed Nov. 5, 2008. U.S. Provisional Patent Application 61/111,716 and PCT Application PCT/US2009/030364, published as WO 2010/053590, are incorporated herein by reference.

FIELD OF THE INVENTION

The present invention relates to saving power in an integrated circuit.

BACKGROUND OF THE INVENTION

The use of configurable integrated circuits ("ICs") has dramatically increased in recent years. Configurable ICs can be used to implement circuits designed by a user ("user design") on an IC without having to fabricate a new IC for each design. One example of a configurable IC is a field programmable gate array ("FPGA"). A configurable IC has several circuits for performing different operations. Configurable circuits can be configured by configuration data to perform a variety of different operations. These circuits can range from logic circuits (e.g., configurable lookup tables, or "LUTs") to interconnect circuits (e.g., configurable multiplexers). The circuits of a configurable IC are often made up of a multitude of transistors.

The circuits of a configurable IC are typically fabricated on a semiconductor substrate. Almost any integrated circuit design requires connections from transistors on one part of the substrate to transistors on other parts of the substrate. These transistors are often connected by small metal or polysilicon wires that traverse several wiring layers above a substrate. Such connections can also include vias that allow signals from one wiring plane to pass to another wiring plane.

Connections between circuits in a configurable IC often have inline buffers that serve several purposes. For example, a buffer may be used to regenerate signals passing along a set of wires, or to increase the current drive for driving a signal by a certain factor. This factor is referred to as "fan out" (e.g., a fan out of 3 means a buffer provides 3 times the current drive at its output as it receives at its input). It has been found that an optimal fan out is Euler's number (e), or approximately 2.7. As an approximation of e, a fan out of three is commonly used. For example, if a total fan out of 27 is desired, a first buffer is used to provide a current drive at its output that is 3 times the current drive at the buffer's input. A second buffer increases the current drive by 3 times (resulting in a 9 times increase from the original current drive), and a third buffer increases the current drive by 3 times (resulting in the desired 27 times increase).

Buffers consume dynamic power in order to operate. Buffers are powered by a power source that supplies a certain voltage ($V_{PS}$). Dynamic power is consumed when a buffer's transistor's output switches from low to high, or vice versa. This voltage difference is referred to as swing voltage ($V_{swing}$). The amount of dynamic power consumed by a buffer is directly proportional to $C*V_{PS}*V_{swing}*f$, where C is the capacitance being driven by the buffer, $V_{PS}$ is the voltage supplied to the buffer, and f is the frequency.

As circuits progressively become smaller and more densely packed on an IC, power consumption becomes an issue, as the existence of more circuits inevitably leads to greater power requirements. Furthermore, power consumption increases as operational speed increases. One currently existing method of saving power in an IC is to simply lower the operational voltage $V_{PS}$ of the IC. However, reducing $V_{PS}$ yields the undesirable effect of reducing current in the IC and introducing delay, thus resulting in an overall performance loss. Another method for reducing the amount of dynamic power consumed includes variably reducing $V_{PS}$ in accordance with the power needs of the IC. However, this approach is often based on heuristics which may not be accurate for determining (1) when to reduce or increase supplied power, and (2) how much power should be increased or decreased. Another approach for reducing power uses voltage islands. However, this approach requires a great deal of overhead, thus reducing performance. Using voltage islands also limits flexibility in designing ICs, as the IC must be built and configured in order to accommodate the voltage islands.

Additionally, leakage current is becoming more problematic as smaller devices (e.g., smaller transistors) and thinner dielectric materials (e.g., thinner oxides) are being used. Leakage is the flow of current through a transistor even when the transistor is "off." For example, when a PMOS transistor is in its off state, the difference between its gate and source voltages ($V_{GS}$) is zero. However, notwithstanding this zero gate-source voltage $V_{GS}$, the PMOS transistor still experiences a small amount of current flow (i.e., leakage). This leakage problem is exacerbated when (1) its threshold voltage $V_T$ is lowered, and/or (2) a thinner dielectric material (e.g., a thinner oxide) is used for the transistor. While a lower threshold voltage provides a faster switching PMOS transistor, the lower threshold voltage also causes an increase in the amount of leakage current that the PMOS transistor experiences in its off state. Similarly, transistors with thinner oxides—while faster-switching than transistors with thicker oxides—are leakier than their thicker-oxide counterparts (i.e., they experience more current leakage in their off state).

Therefore, there is a need in the art for a way to save power in an IC without reducing performance or introducing leakage current.

BRIEF DESCRIPTION OF THE DRAWINGS

The novel features of the invention are set forth in the appended claims. However, for purpose of explanation, several embodiments of the invention are set forth in the following figures.

SUMMARY OF THE INVENTION

Figure 1:
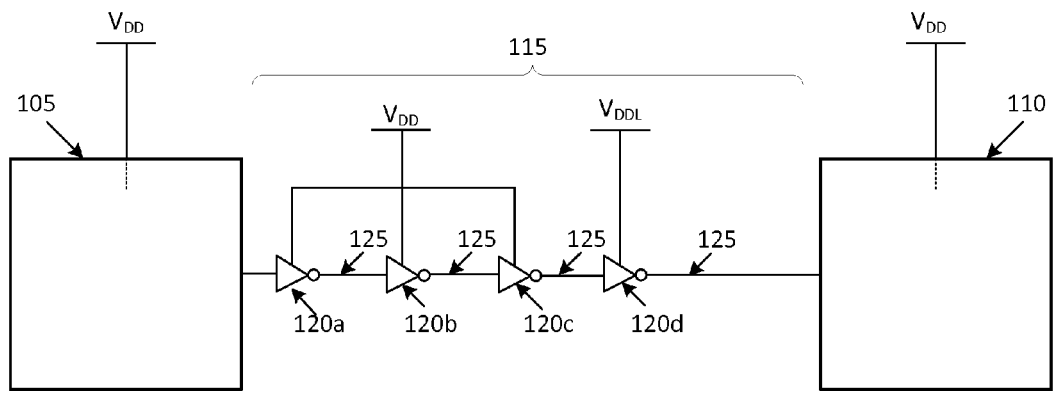
FIG. 1 illustrates an embodiment of the invention where a buffer driving a wire on a direct connection is supplied with a lowered voltage.

Some embodiments provide a power-saving scheme for reducing power consumption in integrated circuits ("ICs"). For instance, in some embodiments that are used in ICs with configurable circuits, power consumption is reduced by reducing the voltage passing across the routing fabric of the IC. The routing fabric of the IC includes numerous direct connections that connect the circuits (e.g., configurable circuits) of the IC. In some embodiments, some direct connections are made up at least partially of wires and buffers that drive the wires. Some embodiments reduce the IC's power consumption by operating one or more buffers of one or more direct connections at a lower first power supply voltage (e.g., $V_{DD}$ minus 0.2V to 0.5V, or minus an NMOS threshold $V_T$), while operating some of the other circuits of the IC at a higher second power supply voltage (e.g., $V_{DD}$). As power supply voltage $V_{PS}$ has a direct impact on dynamic power consumption, operating one or more buffers at reduced voltage levels reduces the dynamic power consumption of the one or more buffers and thereby reduces the overall power consumption of the IC.

The buffers that operate at the lower first voltage pass signals on the wires that they drive at the lower first voltage. These lower voltages are received by one or more circuits (e.g., one or more configurable logic and/or interconnect circuits) in the IC. Such a receiving circuit in some embodiments includes a level-converting sub-circuit that level-converts the lower first voltage to the higher second voltage on which the rest of the receiving circuit operates.

In some embodiments, the level-converting sub-circuit is a differential level-converting circuit, which quickly pulls up the lower first voltage to the higher second voltage. Some embodiments implement this differential level-converting circuitry while implementing each logical signal as a single physical signal. Other embodiments use the differential level-converting circuitry with differential signaling (i.e., while implementing each logical signal as a differential physical signal). Yet other embodiments use some differential level-converting circuits of the IC with differential signaling while using other differential level-converting circuits with non-differential signaling. Still other embodiments use non-differential level-converting circuits for some of the signals (e.g., for some differential signals and/or non-differential signals), while using differential level-converting circuits for other signals (e.g., for other differential signals and/or non-differential signals).

Different embodiments implement direct connections and buffers differently. For instance, one direct connection can be implemented at least partially by two sets of wires that carry complementary values when this connection implements differential signaling, while another direct connection can be implemented by one set of wires that carry a single non-differential signal when the connection implements non-differential signaling.

Some embodiments utilize a traditional CMOS inverter design (i.e., a PMOS transistor coupled with an NMOS transistor) to implement each buffer of a direct connection. However, other embodiments use an NMOS-NMOS inverter design for some or all of the buffers (e.g., the buffers that operate at the lower voltage level) in order to reduce the voltage swing $V_{swing}$ of the buffers. As the voltage swing $V_{swing}$ of a buffer bears a direct impact to the dynamic power consumption of a buffer, reducing the voltage swing $V_{swing}$ of the buffer reduces the dynamic power consumption of the buffer.

To increase the power savings in a direct connection, some embodiments implement the direct connection by using (1) differential signaling, (2) differential level converting circuitry, (3) an NMOS-NMOS inverter for one or more of the buffers (e.g., the most downstream buffer of a set of buffers) that forms the direct connection, and (4) a lowered power supply voltage $V_{PS}$. The NMOS-NMOS structure of the buffer significantly reduces the power consumed by the direct connection by reducing the voltage swing $V_{swing}$ of the one or more NMOS-NMOS inverters of the direct connection. Moreover, the supplying of a lowered power supply voltage $V_{PS}$ yields further power consumption reduction. Lowering (1) the swing voltage $V_{swing}$ and (2) the power supply voltage $V_{PS}$ reduces power consumption without introducing additional delay in the direct connection.

Instead of using an NMOS-NMOS inverter for one or more buffers of a direct connection, some embodiments use, as mentioned above, traditional CMOS inverters for such buffers. Unlike an NMOS-NMOS inverter, which uses an NMOS transistor for pull-up, a traditional CMOS inverter uses a PMOS transistor for pull-up. Such a pull-up PMOS transistor may be desirable over an NMOS transistor in some cases, as a pull-up NMOS transistor usually outputs a signal at a power supply voltage minus some amount (e.g., an NMOS transistor threshold). In contrast, a pull-up PMOS transistor outputs a signal at the full power supply voltage.

In some of the embodiments that implement these buffers as CMOS inverters, a CMOS inverter that is powered by a lowered power supply voltage $V_{DDL}$ (e.g., the most downstream inverter in a set of inverters) includes a PMOS transistor that has been fabricated with an appropriate level of doping to cause it to have a lowered threshold voltage $LV_T$. This lowered threshold voltage $LV_T$ allows the PMOS transistor to switch faster than if it were fabricated with a level of doping that caused it to have a standard threshold voltage $SV_T$ that is higher than the lowered threshold voltage $LV_T$.

The use of the lowered power supply voltage $V_{DDL}$, in conjunction with the lowered threshold voltage $LV_T$, yields a "hard off" PMOS transistor that has a gate-source voltage $V_{GS}$ of greater than zero in its "off" state (as opposed to an ordinary PMOS transistor, which has a gate-source voltage $V_{GS}$ of zero in its "off" state). This positive gate-source voltage $V_{GS}$ in the off state results in a reduction of leakage current. Thus, this "hard off" PMOS transistor switches faster than, but does not experience greater leakage than, an ordinary PMOS transistor that (1) receives a higher power supply voltage (e.g., $V_{DD}$ as opposed to $V_{DDL}$) and (2) has a higher threshold voltage (e.g., $SV_T$ as opposed to $LV_T$).

Instead of, or in conjunction with, supplying a lowered power supply voltage $V_{DDL}$ to a low-threshold voltage $LV_T$ PMOS transistor of a CMOS inverter, other embodiments apply this "hard off" concept (i.e., a positive gate-source voltage $V_{GS}$ to turn off a PMOS transistor) to other PMOS transistors that implement a user design in an IC. Examples of such PMOS transistors include PMOS transistors that experience leakage current in their "off" state, such as fast-switching PMOS transistors with thinner oxides than other transistors of an IC. In some embodiments, these "hard off" PMOS transistors are components of other circuits in the IC. For instance, in some embodiments, these "hard off" PMOS transistors are components of any IC circuit that is in the signal path for implementing a user design, any circuit in a core of the IC, any circuit that includes thin-oxide transistors, or any circuit that includes transistors with the smallest gates in the IC. Furthermore, while such "hard off" PMOS transistors in some embodiments are used in ICs that include configurable circuits, "hard off" PMOS transistors can also be used in any other type of IC (e.g., non-configurable ICs, such as microprocessors, microcontrollers, application-specific integrated circuits, or ASICs, etc.) in order to provide fast-switching PMOS transistors that do not experience excessive leakage current.

To provide the two different voltages to the circuits of the IC, some embodiments supply two different voltages (i.e., the lower first voltage and the higher second voltage) to the IC from two different power supplies that are not physically located on the IC (i.e., from two different power supplies that are located "off-chip"). In some embodiments, one of the voltages (e.g., the higher second voltage) is a core voltage $V_{core}$, while the other voltage (e.g., the lower first voltage) is a voltage $LV_{core}$ that is lower than the core voltage $V_{core}$. While some embodiments provide the two different voltages from off-chip, some embodiments generate at least one of the two voltages with one or more circuits that are located on the IC (i.e., with an "on-chip" circuit). In some embodiments, these circuits receives a higher first voltage (e.g., $V_{core}$) from the outside, and generate a lower second voltage (e.g., $LV_{core}$) inside the IC.

DETAILED DESCRIPTION OF THE INVENTION

In the following description, numerous details are set forth for purpose of explanation. However, one of ordinary skill in the art will realize that the invention may be practiced without the use of these specific details. For instance, well-known structures and devices are shown in block diagram form in order not to obscure the description of the invention with unnecessary detail.

Some embodiments provide a power-saving scheme for reducing power consumption in an integrated circuit ("IC") with configurable circuits by reducing the voltage passing across the routing fabric of the IC. The routing fabric of the IC includes numerous direct connections that connect circuits (e.g., configurable circuits) of the IC. In some embodiments, some direct connections are made up at least partially of wires and buffers that drive the wires. Some embodiments reduce the IC's power consumption by operating one or more buffers of one or more direct connections at a lower first voltage (e.g., $V_{DD}$ minus 0.2V to 0.5V, or minus an NMOS threshold $V_T$), while operating some of the other circuits of the IC at a higher second voltage (e.g., $V_{DD}$). Operating one or more buffers at reduced voltage levels reduces the dynamic power consumption of the buffers and thereby reduces the overall power consumption of the IC.

FIG. 1 illustrates an example of a direct connection 115 that includes a buffer 120d that operates at a reduced power supply voltage. Specifically, in this figure, the direct connection 115 supplies a signal from a source circuit 105 to a destination circuit 110 of an IC. In some embodiments, the two circuits 105 and 110 are two circuits of an IC that includes several configurable circuits. Either or both of the circuits 105 and 110 can be a configurable circuit, such as a configurable logic circuit (e.g., a configurable LUT) or a configurable interconnect circuit (e.g., a configurable multiplexer). In this figure, the circuits 105 and 110 operate based on a power supply voltage $V_{DD}$ that they receive.

As shown in FIG. 1, the direct connection 115 is formed by a set of wires 125 and a set of intervening inverters 120 that serve as buffers for passing signals from the source circuit 105 to the destination circuit 110. In some embodiments, each intervening inverter is a non-controllable circuit element that simply provides, at its output, an inverted version of the signal that it receives at its input. In some embodiments, the most downstream buffer 120d of the set of buffers 120 operates at a lowered voltage $V_{DDL}$ (e.g., $V_{DD}$ minus 0.2V to 0.5V, or minus an NMOS threshold $V_T$), while the other buffers 120a-c operate at the power supply voltage $V_{DD}$. Because the buffer 120d operates at the reduced operating voltage $V_{DDL}$, the buffer 120d supplies the signal to the destination circuit 110 at the lowered voltage $V_{DDL}$. Operating the buffer 120d at the reduced voltage level reduces the dynamic power consumption of this buffer and thereby reduces the overall power consumption of the IC.

In some embodiments, the destination circuit 110 level converts this signal back up to the power supply voltage $V_{DD}$ because the destination circuit 110 operates at the power supply voltage $V_{DD}$. To do this, the destination circuit 110 in some embodiments includes a level-converting sub-circuit that allows the destination circuit 110 to level-convert the received lower voltage signal to the power supply voltage $V_{DD}$.

Figure 2:
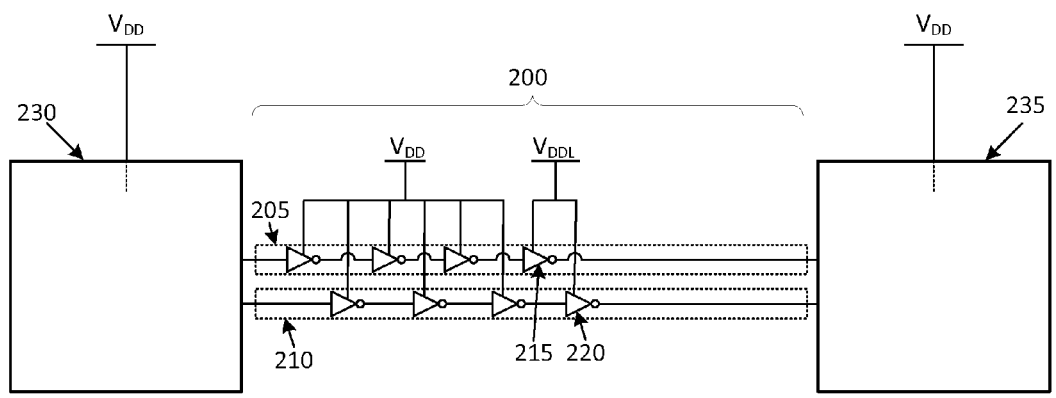
FIG. 2 illustrates an embodiment of the invention where a buffer driving a wire on a differential direct connection is supplied with a lowered voltage.

FIG. 1 illustrates an example where the direct connection has a single-ended physical design. However, a direct connection can instead be implemented in a differential manner. FIG. 2 illustrates an example of a differential direct connection 200 that supplies a single logical signal from a source circuit 230 to a destination circuit 235. Specifically, in this figure, the direct connection 200 is implemented by two sets of wires and buffers 205 and 210 that together transfer one logical signal in terms of two complementary physical signals. Each set of wires and buffers 205 and 210 carries one physical signal, but the two physical signals are analyzed together to represent one logical signal. One of the sets of wires and buffers 205 carries a "true" signal, while the other set of wires and buffers 210 carries a "complement" signal.

In this example, the most downstream buffers 215 and 220 in the true path 205 and the complement path 210 operate at a lowered voltage $V_{DDL}$ (e.g., $V_{DD}$ minus 0.2V to 0.5V, or minus an NMOS threshold $V_T$) while the other buffers in both paths operate at the power supply voltage $V_{DD}$. Because the buffers 215 and 220 operate at the reduced operating voltage $V_{DDL}$, they supply the differential signal to the destination circuit 235 with the high physical value of this logical signal represented by a lowered voltage value $V_{DDL}$.

Like the destination circuit 110 of FIG. 1, the destination circuit 235 of FIG. 2 includes a level-converting circuit to level-convert the received lower voltage $V_{DDL}$ differential signal to the power supply voltage $V_{DD}$ (i.e., to convert the lower voltage $V_{DDL}$ high value of the differential signal to $V_{DD}$). In some embodiments, the destination circuit 235 includes a differential level-converting circuit that allows the destination circuit 235 to quickly pull up the lower voltage $V_{DDL}$ signals that it receives to the power supply voltage $V_{DD}$.

Several more detailed embodiments of the invention are described in the sections below. Before describing these embodiments further, an overview of the configurable IC architecture used by some embodiments to implement a routing fabric is given in Section I below. This discussion is followed by Section II, which discusses various power saving implementations of some embodiments of the invention. Next, Section III discusses advantages of various implementations of some embodiments. Section IV then describes a configurable IC with low power interconnects. Then, Section V discusses low-power "hard off" PMOS transistors. Section VI then discusses ICs that receive multiple different voltages. Lastly, Section VII describes an electronics system that includes an IC which implements some of the embodiments of the invention.

I. Configurable IC Architecture

A. Integrated Circuits

An integrated circuit ("IC") is a device that includes numerous electronic components (e.g., transistors, resistors, diodes, etc.) that are typically embedded on the same substrate, such as a single piece of semiconductor wafer. These components are connected with one or more layers of wiring to form multiple circuits, such as Boolean gates, memory cells, arithmetic units, controllers, decoders, etc. An IC is often packaged as a single IC chip in one IC package, although some IC chip packages can include multiple pieces of wafer (also called die or substrate).

B. Configurable Circuits

Some ICs are configurable ICs. A configurable IC is an IC that has configurable circuits. A configurable circuit is a circuit that can "configurably" perform a set of operations. Specifically, a configurable circuit receives and stores "configuration data" that specifies the operation that the configurable circuit has to perform in the set of operations that it can perform. In some embodiments, configuration data is generated outside of the configurable IC. For instance, a set of software tools typically converts a high-level IC design (e.g., a circuit representation or a hardware description language design) into a set of configuration data that can configure the configurable IC (or more accurately, the configurable IC's configurable circuits) to implement the IC design.

Examples of configurable circuits include configurable interconnect circuits and configurable logic circuits. A logic circuit is a circuit that can perform a function on a set of input data that it receives. A configurable logic circuit is a logic circuit that can be configured to perform different functions (e.g., AND, OR, XOR, etc.) on its input data set.

A configurable interconnect circuit is a circuit that can configurably connect an input set to an output set in a variety of manners. An interconnect circuit can connect two terminals or pass a signal from one terminal to another by establishing an electrical path between the terminals. Alternatively, an interconnect circuit can establish a connection or pass a signal between two terminals by having the value of a signal that appears at one terminal appear at the other terminal. In connecting two terminals or passing a signal between two terminals, an interconnect circuit in some embodiments might invert the signal (i.e., might have the signal appearing at one terminal inverted by the time it appears at the other terminal). In other words, the interconnect circuit of some embodiments implements a logic inversion operation in conjunction to its connection operation. Other embodiments, however, do not build such an inversion operation in some or all of their interconnect circuits.

The configurable IC of some embodiments includes configurable logic circuits and configurable interconnect circuits for routing the signals to and from the configurable logic circuits. In addition to configurable circuits, a configurable IC also typically includes non-configurable circuits (e.g., non-configurable logic circuits, interconnect circuits, memories, etc.).

In some embodiments, the configurable circuits might be organized in an arrangement that has all the circuits organized in an array with several aligned rows and columns. In addition, within such a circuit array, some embodiments disperse other circuits (e.g., memory blocks, processors, macro blocks, IP blocks, SERDES controllers, clock management units, etc.).

Figure 3A:
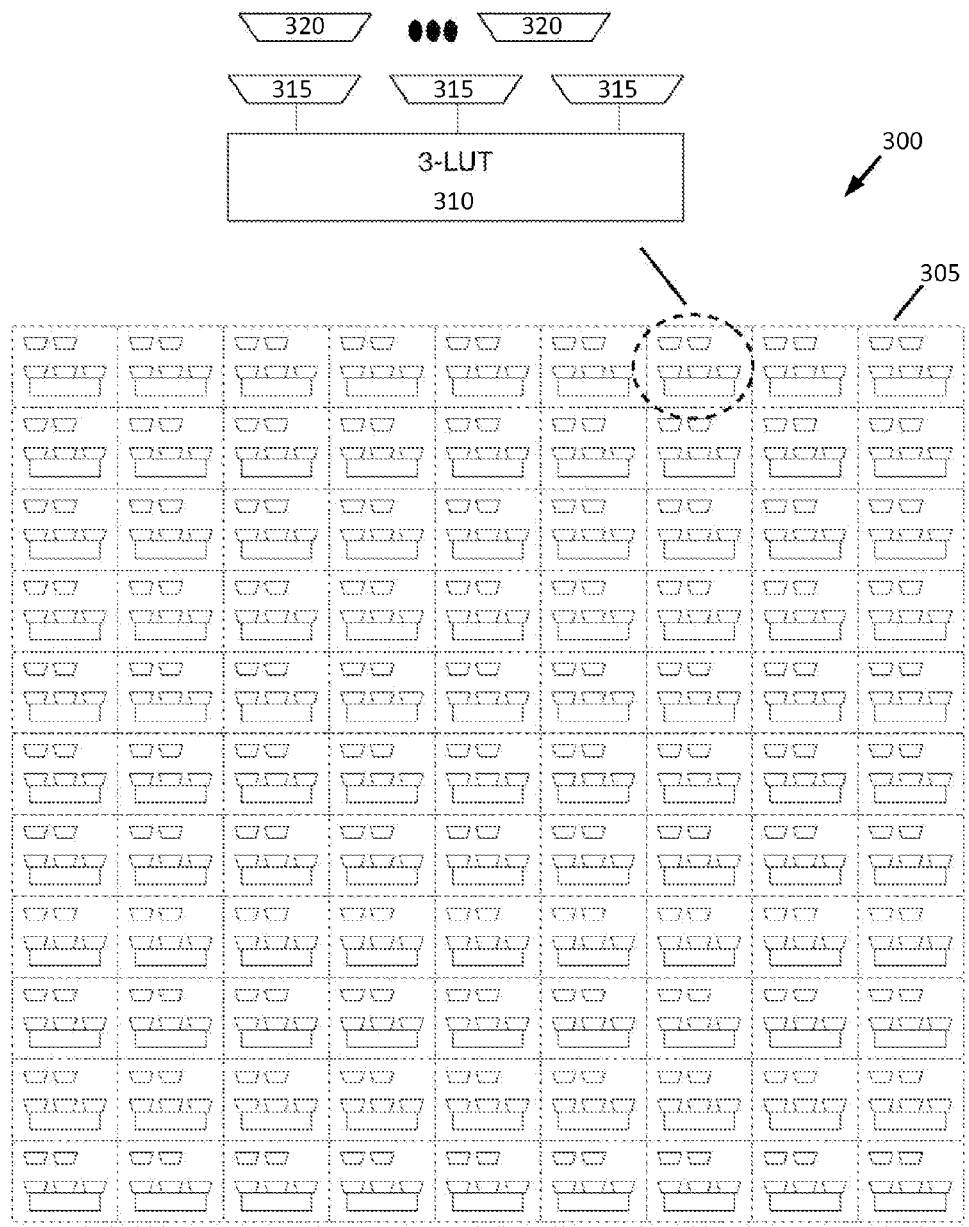
FIGS. 3A and 3B illustrate example architectures of an integrated circuit ("IC").
Figure 3B:
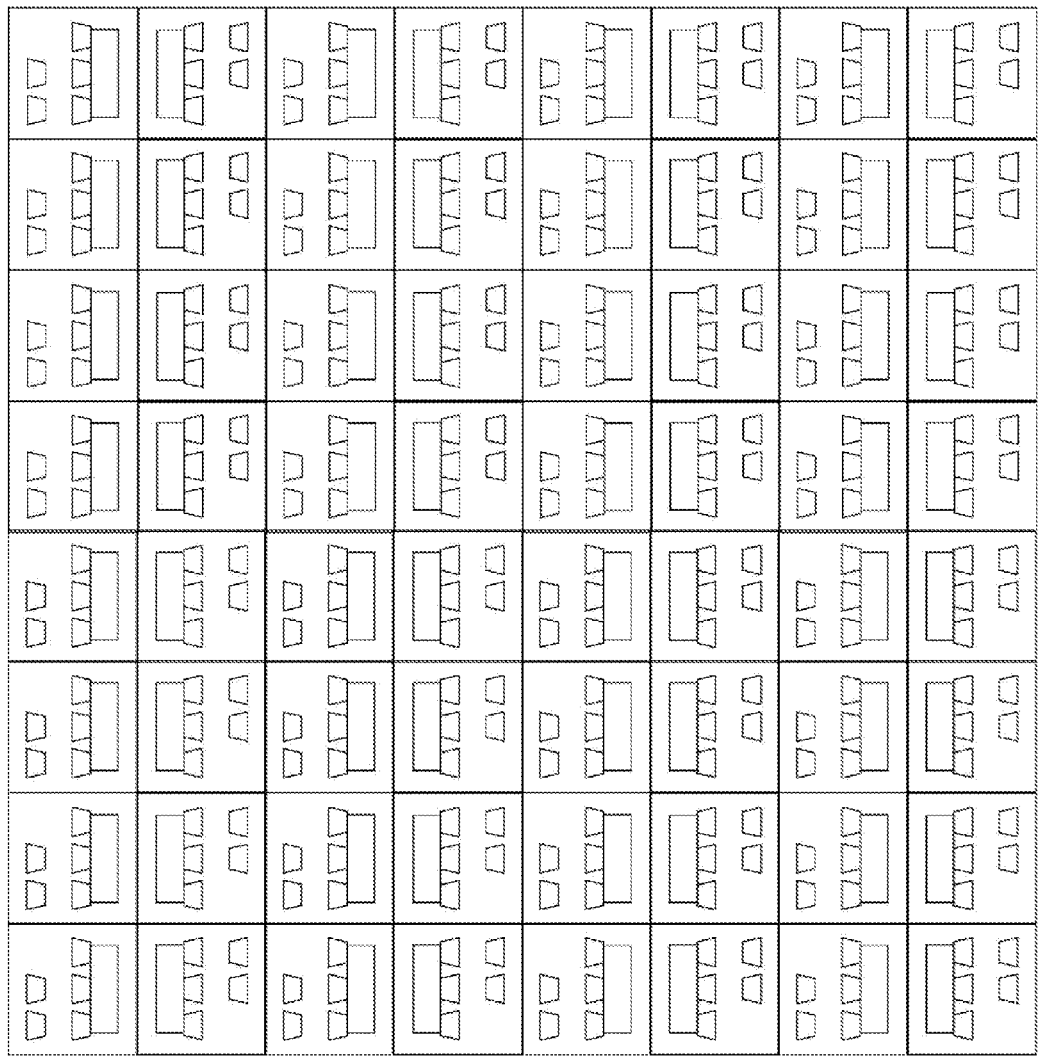
Figure 4:
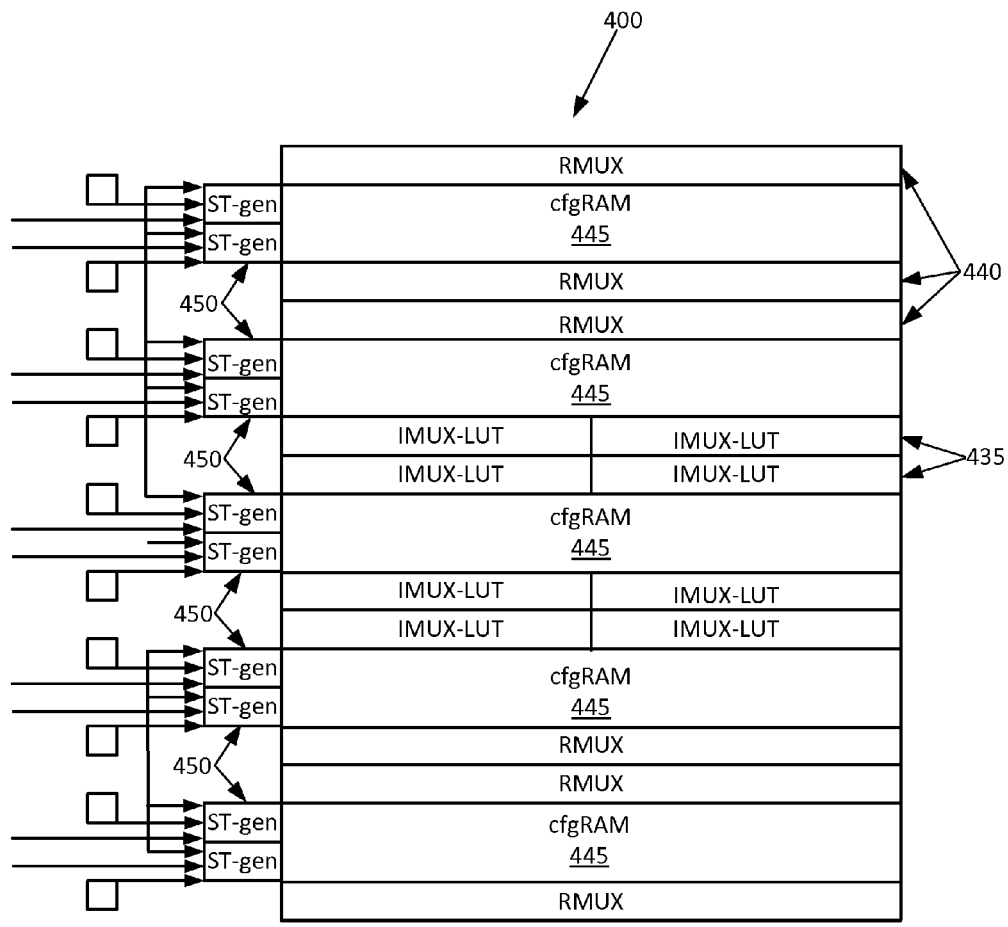
FIG. 4 illustrates an example layout of a configurable tile.

FIGS. 3A, 3B, and 4 illustrate several examples of configurable circuit arrangements/architectures that include some embodiments of the invention's circuits. FIG. 3A illustrates an architecture 300 that is formed by numerous configurable "tiles" 305 that are arranged in an array with multiple rows and columns. In FIG. 3A, each configurable tile 305 includes a configurable three-input LUT 310, three configurable input-select multiplexers 315, and several configurable routing multiplexers 320. Different embodiments have different numbers of configurable routing multiplexers 320. For instance, some embodiments may have eight configurable routing multiplexers 320 in a configurable tile 305, while others may have more or less configurable routing multiplexers 320 in a configurable tile 305. For each configurable circuit (e.g., configurable routing multiplexers 320), the configurable IC 300 includes a set of storage elements (e.g., a set of SRAM cells) for storing a set of configuration data.

In the example illustrated in FIG. 3A, the configurable logic circuits are look-up tables 310 ("LUTs"), while the interconnect circuits are input-select multiplexers 315 that configurably (i.e., based on configuration data) select the inputs of the LUTs 310. In some embodiments, the LUTs 310 and the multiplexers 315 are sub-cycle reconfigurable circuits. In some of these embodiments, the configurable IC stores multiple sets of configuration data for a sub-cycle reconfigurable circuit, so that the reconfigurable circuit can use a different set of configuration data in different sub-cycles. Other configurable tiles can include other types of circuits, such as memory arrays instead of logic circuits. Sub-cycle reconfigurable circuit elements are further described in U.S. Pat. No. 7,295,037, entitled "Configurable IC with Routing Circuits with Offset Connections," issued Nov. 13, 2007, and U.S. Pat. No. 7,342,415, entitled Configurable IC with Interconnect Circuits that also Perform Storage Operations and issued on Mar. 11, 2008. The contents of U.S. Pat. No. 7,295,037, and U.S. Pat. No. 7,342,415, are incorporated herein by reference.

In FIG. 3A, an input-select multiplexer 315 (also referred to as an "IMUX") is an interconnect circuit associated with the LUT 310 that is in the same configurable tile 305 as the input-select multiplexer 315. One such input-select multiplexer 315 receives several input signals for its associated LUT 310 and passes one of these input signals to its associated LUT 310. In some embodiments, one or more of the input-select multiplexers 315 are hybrid input-select/logic circuits (referred to as HMUXs) capable of performing logic operations as well as functioning as input select multiplexers. An HMUX is a multiplexer that can receive either user-design signals, configuration data, or both along its select lines. HMUXs are further described in U.S. Pat. No. 7,224,182, entitled "Hybrid Configurable Circuit for a Configurable IC," issued May 29, 2007. The contents of this Patent, namely U.S. Pat. No. 7,224,182, are herein incorporated by reference.

In FIG. 3A, a routing multiplexer 320 (also referred to as an "RMUX") is an interconnect circuit that, at a macro level, connects other logic and/or interconnect circuits. In other words, unlike an input-select multiplexer 315 in these figures that only provides its output to a single logic circuit, a routing multiplexer 320 of some embodiments either provides its output to several logic and/or interconnect circuits, or provides its output to at least one other interconnect circuit.

In some embodiments, the RMUXs 320 depicted in FIG. 3A form a configurable routing fabric along with the wire segments that connect to the RMUXs 320 and the vias that connect to these wire segments and/or to the RMUXs 320. In some embodiments, the configurable routing fabric further includes buffers (such as buffers 120a-d of FIG. 1) for achieving one or more objectives (e.g., achieving a greater fan out, maintaining the signal strength, reducing noise, altering signal delay, etc.) vis-a-vis the signals passing along the wire segments.

Various wiring architectures can be used to connect the RMUXs 320, IMUXs 315, and LUTs 310. Several examples of the wire connection scheme are described in the above-referenced U.S. Pat. No. 7,295,037, entitled "Configurable IC with Routing Circuits with Offset Connections," issued Nov. 13, 2007.

In some embodiments, the examples illustrated in FIG. 3A represent the actual physical architecture of a configurable IC. However, in other embodiments, FIG. 3A only topologically illustrates the architecture of a configurable IC (i.e., conceptually shows the configurable IC without specifying a particular geometric layout for the position of the circuits), so that the position and orientation of the circuits in the actual physical architecture of this IC are different from those shown in FIG. 3A. FIG. 3B illustrates one possible physical architecture of the configurable IC 300 illustrated in FIG. 3A.

Some embodiments utilize alternative tile structures. For instance, FIG. 4 illustrates an alternative tile structure that is used in some embodiments. This tile 400 has two sets 435 of four-aligned LUTs along with their associated IMUXs. The tile 400 also includes six sets 440 of RMUXs and five banks of configuration RAM storage 445. The configuration of each configurable circuit (e.g., the configurable circuits of a particular set 435 of four-aligned LUTs and associated IMUXs) is changed by receiving different configuration data sets from the configuration RAM 445 at different clock cycles. At a particular clock cycle, one bit of configuration data is supplied to a set 435 of LUTs and associated IMUXs. The tile 400 has ST-gen circuits 450 for providing sub-cycle clock signals to each the configuration RAM 445. These sub-cycle clock signals enable the tile to be reconfigurable during the operation of the IC. Each 4-aligned LUT tile shares one carry chain, one example of which is described in the above-referenced U.S. Pat. No. 7,295,037, entitled "Configurable IC with Routing Circuits with Offset Connections." One of ordinary skill in the art would appreciate that other organizations of LUT tiles may also be used in conjunction with the invention and that these organizations might have fewer or additional tiles.

As mentioned above, the configurable routing fabric of some embodiments is formed by configurable RMUXs, along with the wire segments that connect to the RMUXs, vias that connect to these wire segments and/or to the RMUXs, and buffers that buffer the signals passing along one or more of the wire segments. In some embodiments, configuring the configurable routing fabric to route signals in a desired manner entails supplying RMUXs of the configurable routing fabric with the appropriate configuration data.

Figure 5A:
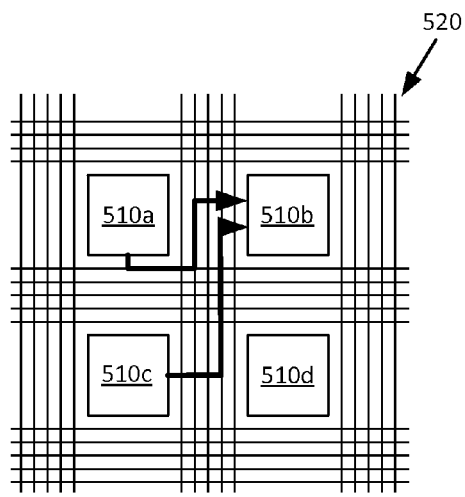
FIGS. 5A-D illustrate exemplary configuration contexts of an IC.
Figure 5B:
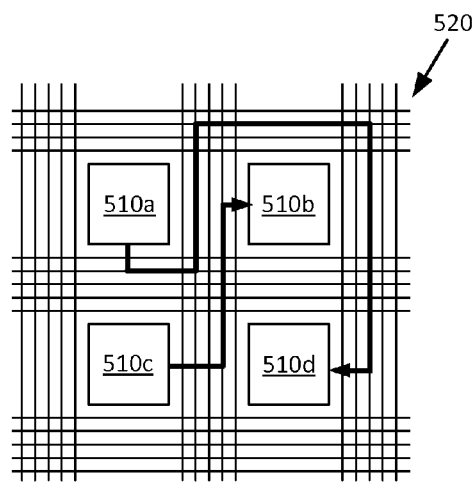
Figure 5C:
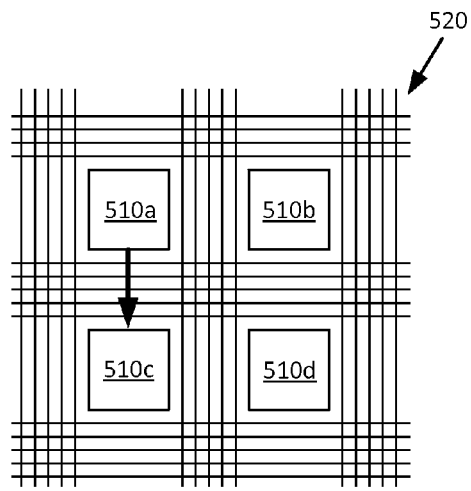
Figure 5D:
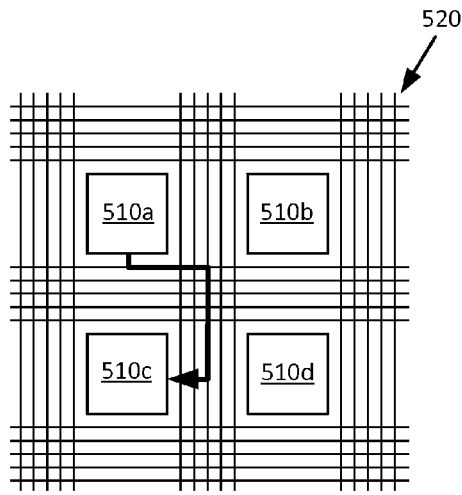

FIGS. 5A-5D illustrate examples of different configurations of the configurable routing fabric 520 of an IC that cause the configurable routing fabric 520 to pass signals between configurable logic circuits 510 and/or non-configurable circuits (e.g., non-configurable memories). For instance, as illustrated by FIGS. 5A and 5B, two different configurable logic circuits 510b and 510d may receive the output of a configurable logic circuit 510a based on different configurations of the configurable routing fabric. Additionally, as shown by FIGS. 5C and 5D, one configurable logic circuit 510c can receive input from another configurable logic circuit 510a through different routing paths based on different configurations of the configurable routing fabric 520. One of ordinary skill in the art would recognize that the examples provided above with respect to FIGS. 5A-5D were merely illustrative, and that many other routing paths (not shown) are possible.

C. Direct Connections

A routing path in the configurable routing fabric may be formed by one or more RMUXs and one or more direct connections connected to the RMUXs. As mentioned above, a direct connection between two circuits (e.g., an RMUX and an IMUX, a LUT and an RMUX, a LUT and another LUT, etc.) is an electrical connection between the two circuits that is achieved by (1) a set of wire segments that traverse through a set of wiring layers of the IC, (2) a set of vias when two or more wiring layers are involved, and/or (3) a set of buffers (e.g., one or more inverters). Besides buffers, direct connections include no other intervening circuits in some embodiments; in other embodiments, direct connections do include other intervening circuits but no other intervening configurable circuits.

Figure 6:
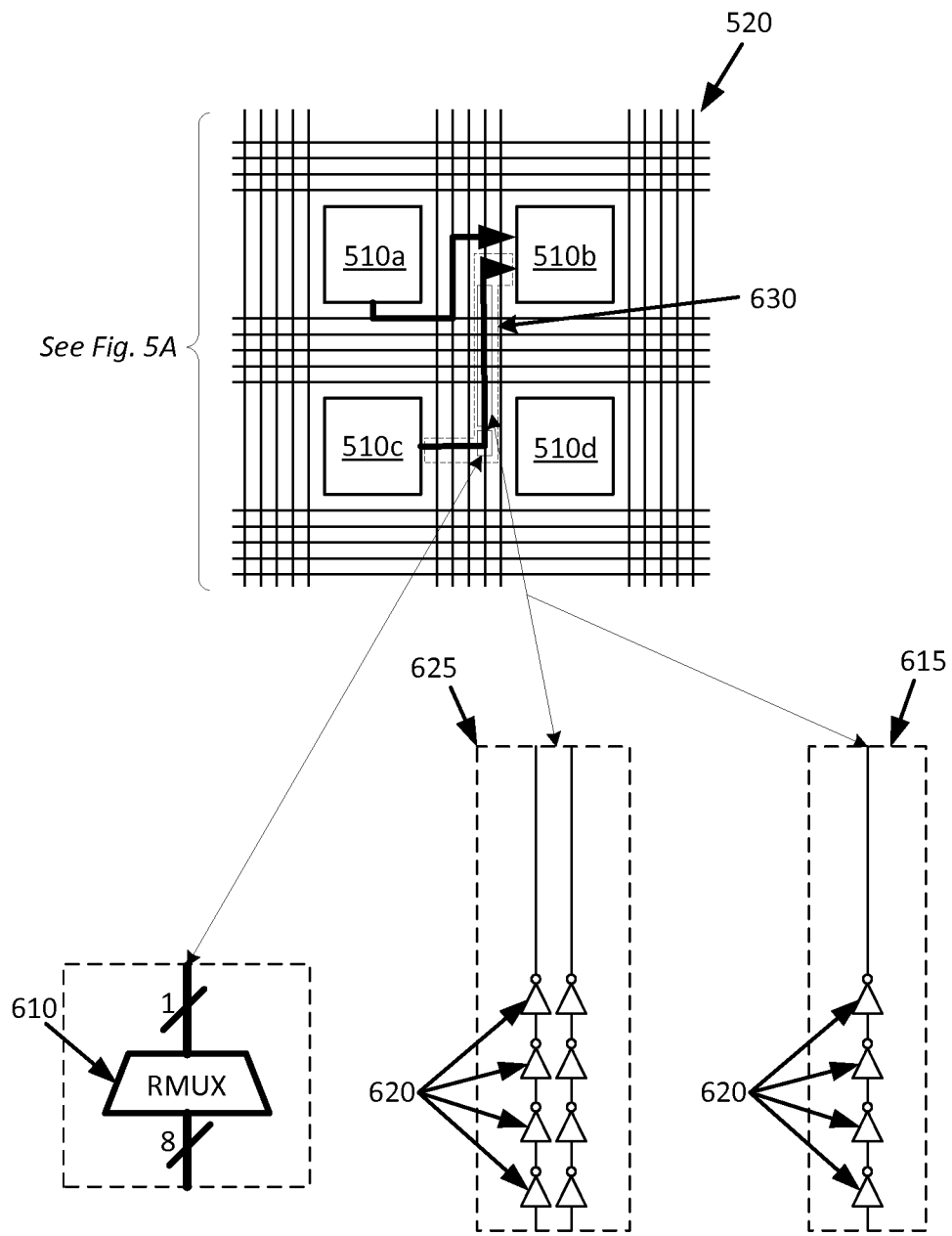
FIG. 6 illustrates detailed views of a configurable routing fabric of an IC.

FIG. 6 illustrates an example of a routing path 630 with at least one direct connection. In some embodiments, this routing path 630 establishes a connection between configurable logic circuits 510b and 510c through the configurable routing fabric 520 in the example illustrated in FIG. 5A. This path 630 is formed by RMUX 610 (which may receive input signals from other sources, such as other configurable logic circuits or RMUXs) and two direct connections: one that supplies the output of logic circuit 510c to the RMUX 610, and one that other supplies the output of the RMUX 610 to the logic circuit 510b. The exploded views 615 and 625 illustrate that a direct connection can have a single-ended implementation 615 or a differential implementation 625. These exploded views 615 and 625 further illustrate that a direct connection of some embodiments can be formed by a set of wires and a set of buffers 620.

II. Buffers Receiving a Different Voltage

As mentioned above, some embodiments reduce power consumption in an integrated circuit ("IC") with configurable circuits by reducing the voltage passing across the IC's routing fabric through low-powered operations of some of the buffers that are part of the routing fabric. Several more detailed implementations of low-powered operation of such buffers will now be described below with reference to FIGS. 7-14.

A. Single-Ended Implementations

Figure 7:
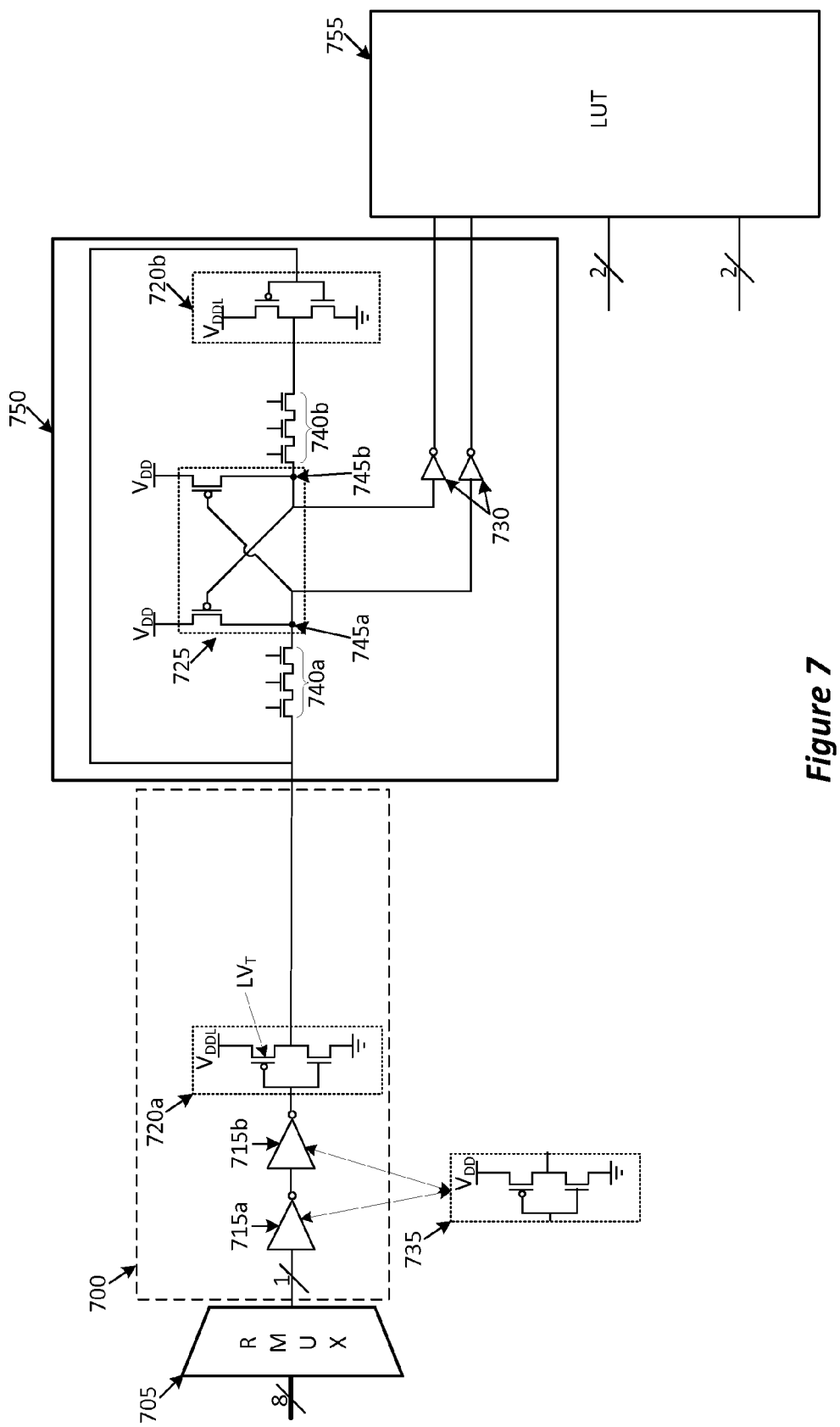
FIG. 7 illustrates an example of a buffer receiving a lowered voltage in accordance with some embodiments of the invention.

FIG. 7 illustrates a technique for reducing the power consumption of a direct connection 700 of an IC with configurable RMUXs, IMUXs, and LUTs. In this figure, the direct connection 700 is implemented as a single-ended connection (i.e., a connection that passes one logical signal as one physical signal). This direct connection 700 provides the output of a source circuit 705 to a destination circuit 750. In this figure, the source circuit 705 is an RMUX, while the destination circuit 750 is an IMUX that supplies its output to a LUT 755. In some embodiments, the LUT 755 also receives input from one or more other IMUXs. The IMUX 750 has a complementary passgate logic ("CPL") implementation, whereby the IMUX 750 implements each logical signal as two complementary physical signals. Moreover, the IMUX 750 receives several logical input values, even though FIG. 7 illustrates only the logical value that it receives from the direct connection 700 in order to simplify this illustration.

The direct connection 700 includes three buffers 715a, 715b, and 720a and four sets of wires, which (1) provide the single physical signal output of the eight-to-one RMUX 705 to the buffer 715a, (2) provide the output of the buffer 715a to the buffer 715b, (3) provide the output of the buffer 715b to the buffer 720a, and (4) provide the output of the buffer 720a to the destination circuit 750.

As shown by the exploded view 735, each of the buffers 715a, 715b, and 720a are CMOS ("complementary metal-oxide semiconductor") inverters formed by stacked PMOS and NMOS transistors that have their gates and their drains tied together. The buffers 715a and 715b are operated at a power supply voltage $V_{DD}$, which is also used to operate the RMUX 705, the IMUX 750, as well as other circuits of the IC.

In order to reduce the power consumption due to the direct connection 700, the buffer 720a, receives a lower power supply voltage $V_{DDL}$, which may be generated from the power supply voltage $V_{DD}$, or may be provided directly by a power supply that is different than the supply that provides the power supply voltage $V_{DD}$. To enhance the performance of the buffer 720a, the pull-up PMOS transistor of the buffer 720a is fabricated with an appropriate level of doping so that it will have a lowered threshold voltage ($LV_T$). The lowered threshold voltage $LV_T$ allows this pull-up PMOS transistor to switch more quickly than a PMOS transistor that has a standard threshold voltage $SV_T$ that is higher than the lowered threshold voltage $LV_T$. The $LV_T$ pull-up transistor's "off" state is a "hard off" state, which prevents the $LV_T$ pull-up transistor of the buffer 720a from experiencing excessive leakage current, while still providing the performance benefit of the lowered threshold voltage $LV_T$. The "hard off" state is further described below in Section V.

The buffer 720a uses the lower power supply voltage $V_{DDL}$ to drive signals that it supplies to the IMUX 750. For instance, the buffer 720a raises its output to the lower power supply voltage $V_{DDL}$ when driving a high value onto this output, while maintaining this output at ground when driving a low value onto the output. As further described below, this reduced voltage swing $V_{swing}$ at the output of the buffer 720a partially results in the power reduction of this buffer 720a.

The IMUX 750 has two sub-circuits that allow it to handle the low-powered, singled-ended output of the buffer 720a. These two circuits are a CMOS inverter 720b and a pair of level-converting cross-coupled transistors 725. The inverter 720b allows the IMUX 750 to convert the single-ended output of the buffer 720a to a differential signal pair that can pass through the CPL multiplexing transistors 740a and 740b of the IMUX. The inverter 720b operates at the lower power supply voltage $V_{DDL}$, similar to the buffer 720a. Thus, the inverter 720b raises its output to the lower power supply voltage $V_{DDL}$ when driving a high value onto this output and maintains this output at ground when driving a low value onto the output.

As mentioned above, the inverter 720b inverts the output of the inverter 720a (which provides a "true" signal of the differential pair supplied to the multiplexing transistors 740) to produce the "complement" signal of the differential pair. The true signal is supplied to the CPL multiplexing transistors 740a, while the complement signal is supplied to the CPL multiplexing transistors 740b.

FIG. 7 illustrates only a part of the CPL multiplexing transistors 740 in order to simplify the circuitry presented in this figure. The CPL multiplexing transistors of the IMUX 750 can have different implementations in different embodiments. For instance, in different embodiments, they can have a different number of stages, a different number of transistors, and different arrangements for connecting the transistors.

Figure 8:
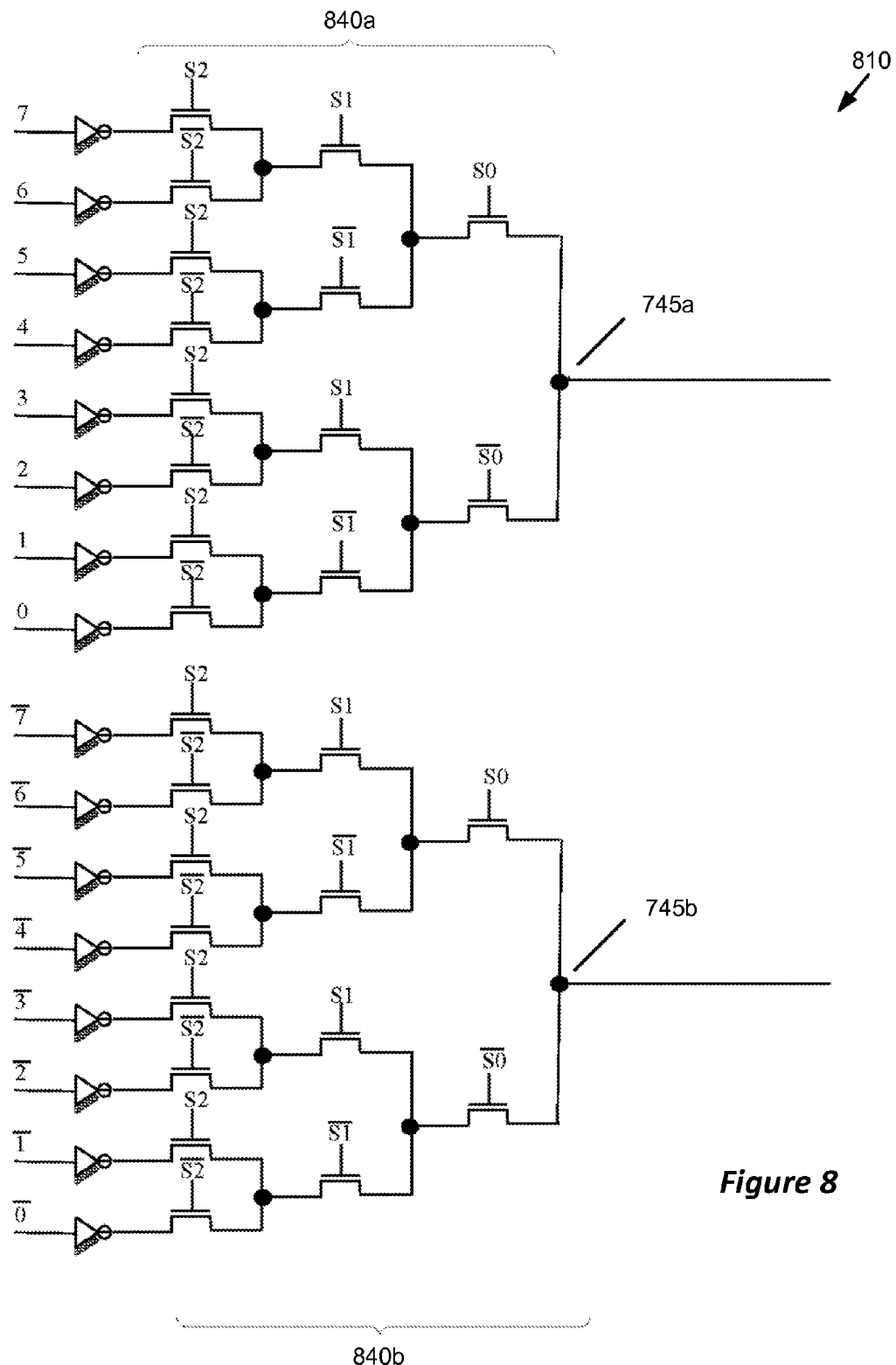
FIG. 8 illustrates an example of complementary passgate logic of an eight-to-one multiplexer that implements differential signaling.

FIG. 8 illustrates one example of one possible implementation for the complementary passgate logic 740 of the IMUX 750, which, in the example shown in FIG. 8, is illustrated as an eight-to-one multiplexer. This figure shows complementary passgate logic 810, which is an exemplary implementation of the complementary passgate logic 740 of the IMUX 750. As shown in this figure, this logic 810 can be formed by two three-stage sets of NMOS transistors 840a and 840b. The logic 810 receives eight complementary pairs of signals as input. The logic 810 also receives three complementary pairs of select signals, which, in some embodiments, are all configuration data values from configuration storage elements (in the case where the IMUX is a configurable IMUX). In other embodiments, one or more of the three complementary pairs of select signals are output of another configurable circuit (in the case where the IMUX is an HMUX).

In FIG. 8, the first stage of pass transistors receives the third select bit S2 or the complement of this bit, the second stage of pass transistors receives the second select bit Si or its complement, while the third stage of pass transistors receives the first select bit S0 or its complement. The three select bits S2, S1, and S0 cause the pass transistors to pass one of the input bits and the complement of this input bit to the complementary internal output nodes 745a and 745b of the CPL logic 810. For instance, when the select bits are 011, the transistor states 840a and 840b pass the 6 and $\overline{6}$ input signals to the output nodes 745a and 745b.

After the CPL multiplexing transistor stage 740, the IMUX 750 of FIG. 7 includes a pair of level-converting cross-coupled transistors 725. Once the input signals propagate to the internal output nodes 745a and 745b of the IMUX 750 through the transistor stages 740, a logical low (i.e., a voltage close to ground) is supplied to the gate of one PMOS transistor of the set 725, while a logical high (i.e., a voltage close to $V_{DDL}$) is supplied to the gate of other PMOS transistor of the set 725. The set of cross-coupled transistors 725 quickly pulls one of these two received values to the power supply voltage $V_{DD}$ with the other value being pulled to ground through one of the transistor stages 740a or 740b. These two values are supplied to two buffering inverters 730 that supply their outputs to the LUT 755. The pull-up from $V_{DDL}$ to $V_{DD}$ prevents the performance of the IMUX 750 from suffering on account of the low power operation of the buffers 720a and 720b (i.e., the reduced voltage that is output from the 720a or 720b). Additionally, the pull-up serves to quickly amplify the signal so that it is deciphered correctly by the LUT 755 that receives the output of the IMUX 750.

In some embodiments, the pair of level-converting cross-coupled transistors 725 is part of the output structure of all of the IMUXs of the IC, irrespective of whether the IMUXs receive signals from one or more direct connections that are operated at a lower voltage. These transistors 725 are used in these IMUXs to generate the voltage at the output nodes 745a and 745b of the IMUXs by quickly pulling one of these nodes to the power supply rail (e.g., in order to compensate for the $V_T$-drop of the NMOS pass transistors while pulling a node to a high voltage). Thus, these embodiments achieve circuit structure efficiency by using the level-converting transistors of the IMUXs for level converting the reduced output voltages of buffers 720a and 720b.

The use of the lowered power supply voltage $V_{DDL}$ illustrated in FIG. 7 (i.e., operating the buffer 720a of the direct connection 700 and the inverter 720b of the IMUX 750 at the lowered power supply voltage $V_{DDL}$) reduces dynamic power consumption of these buffers 720a and 720b. Dynamic power is consumed by a buffer when switching its output from low to high or high to low. The amount of dynamic power consumed when performing this switching is proportional to $$C * V_{PS} * V_{swing}, \quad (A)$$

where C is the capacitance of the load being driven by the buffer (which is dependent upon several factors, including length of the downstream wire and size of the downstream circuit), $V_{PS}$ is the power supply voltage provided to the buffer, and $V_{swing}$ is the swing voltage of the buffer (i.e., the difference between the high and the low voltages that the buffer outputs). The capacitance C that is faced by the most downstream buffer in a set of buffers is often larger than the capacitive load seen by the preceding buffers in the set of buffers on the direct connection.

As is apparent from Equation (A), reducing one or both of $V_{PS}$ and $V_{swing}$ results in a reduction of dynamic power consumption by the buffer. Supplying the lowered power supply voltage $V_{DDL}$ to the buffers 720a and 720b reduces the dynamic power consumption of the buffers 720a and 720b by reducing both of these terms. Specifically, $V_{PS}$ is lowered from a power supply voltage $V_{DD}$ to a lower power supply voltage $V_{DDL}$ and the swing voltage $V_{swing}$ is lowered as well.

In some embodiments, the swing voltage $V_{swing}$ is reduced from ($V_{DD}$-$V_{GND}$) to ($V_{DDL}$-$V_{GND}$), where $V_{GND}$ is the ground voltage. The swing voltage $V_{swing}$ is decreased because the high voltage that each of the buffers 720a and 720b outputs (which is one of the values that dictate the swing voltage) is decreased (i.e., from $V_{DD}$ to $V_{DDL}$). Accordingly, since the dynamic power consumption is proportional to the product of $V_{PS}$ and $V_{swing}$, reducing both terms results in a quadratic reduction in consumption of dynamic power by the buffers that receive a lowered power supply voltage $V_{DDL}$ (e.g., buffers 720a and 720b).

Figure 9:
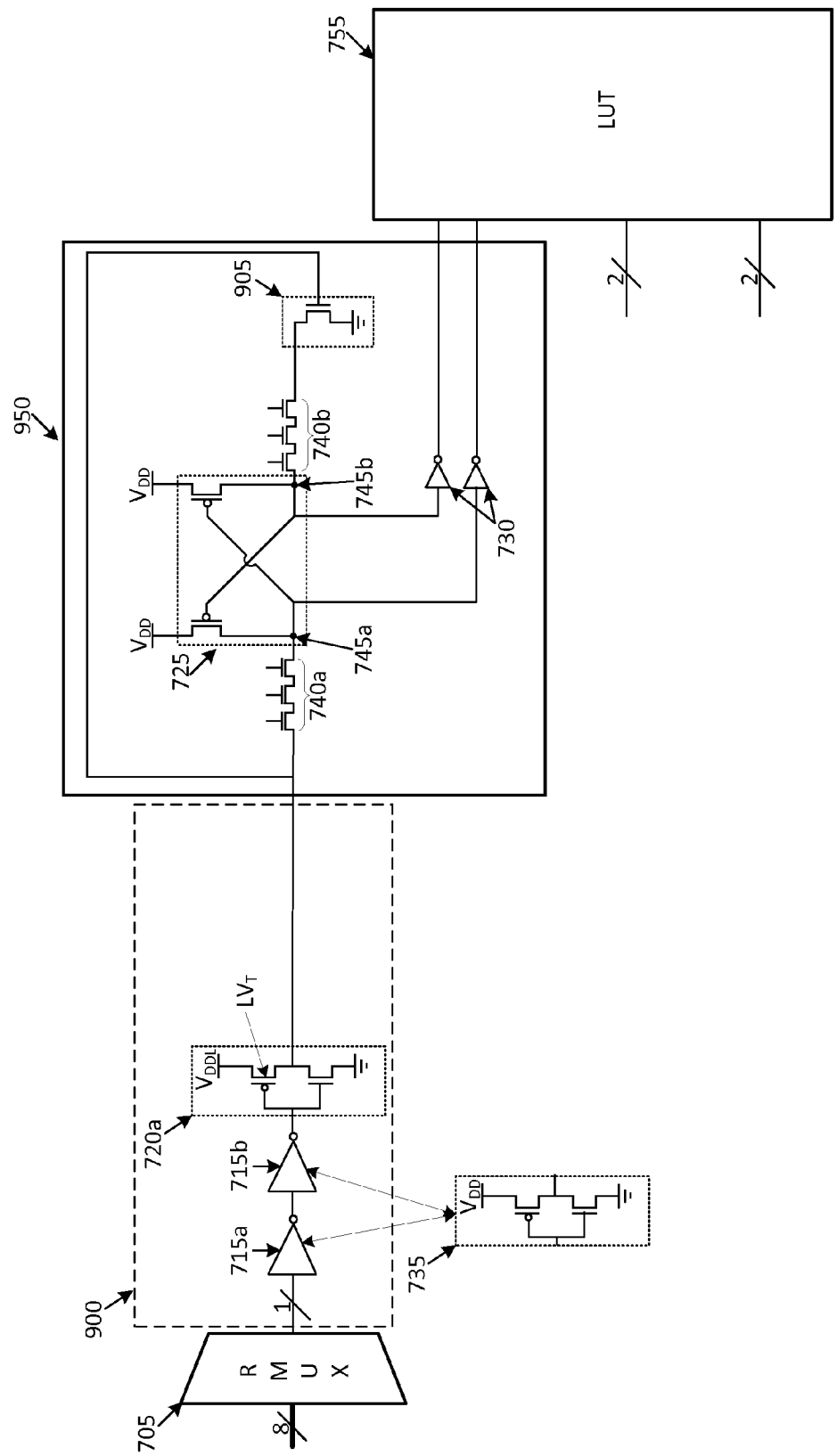
FIG. 9 illustrates another example of a buffer receiving a lowered voltage in accordance with some embodiments of the invention.

FIG. 9 illustrates another technique for reducing the power consumption of a single-ended direct connection 700 in an IC with configurable RMUXs, IMUXs, and LUTs. Like the direct connection 700 of FIG. 7, the direct connection of FIG. 9 is a single-ended direct connection 700 that provides output of a source RMUX 705 to a destination circuit.

However, the example illustrated in FIG. 9 uses a different destination IMUX 950 than the destination IMUX 750 of FIG. 7. The destination IMUX 950 is different from the destination IMUX 750 in that the destination IMUX 950 uses an NMOS transistor 905 instead of a CMOS inverter 720b. This NMOS transistor 905 inverts the output of the buffer 720a when the buffer 720a outputs a high signal, but performs no inversion operation when the buffer 720a outputs a low signal.

The need for this inversion operation from low to high is obviated due to the presence of the cross-coupled PMOS transistors 725. The cross-coupled PMOS transistors 725 quickly use a difference between the two interior nodes 745a and 745b (the difference being due to the difference between the respective outputs of the buffer 720a and the NMOS transistor 905 that are transferred to the interior nodes 745a and 745b) to quickly pull one of the voltages on the interior nodes 745a and 745b to the power supply rail, while the voltage on the other interior node has already been pulled low through one of the transistor stages 740a or 740b.

This implementation of an IMUX 950 with an NMOS transistor 905 provides several power-saving benefits. As explained above by reference to Equation A, dynamic power consumption of a buffer is directly proportional to the swing voltage $V_{swing}$ of the buffer and the power supply voltage of the buffer $V_{PS}$. The buffer 720a on the direct connection 900 of FIG. 9 yields similar power savings as the buffer 720a of the direct connection 700 of FIG. 7 (i.e., dynamic power consumption is reduced because buffer 720a receives a lowered power supply voltage $V_{DDL}$). The use of the NMOS transistor 905 in the IMUX 950 reduces the space occupied by the IMUX 950 because the NMOS transistor 905 replaces a larger CMOS inverter. This space-saving benefit is better understood when realizing that the IMUX 950 receives multiple inputs (e.g., if the IMUX 950 is a sixteen-input IMUX, then sixteen CMOS inverters are replaced by sixteen NMOS transistors 905). Moreover, the use of the NMOS transistor 905 inverter eliminates the need to route a power supply line that a CMOS inverter would ordinarily require, thus further saving space.

B. Differential Implementations

Figure 10:
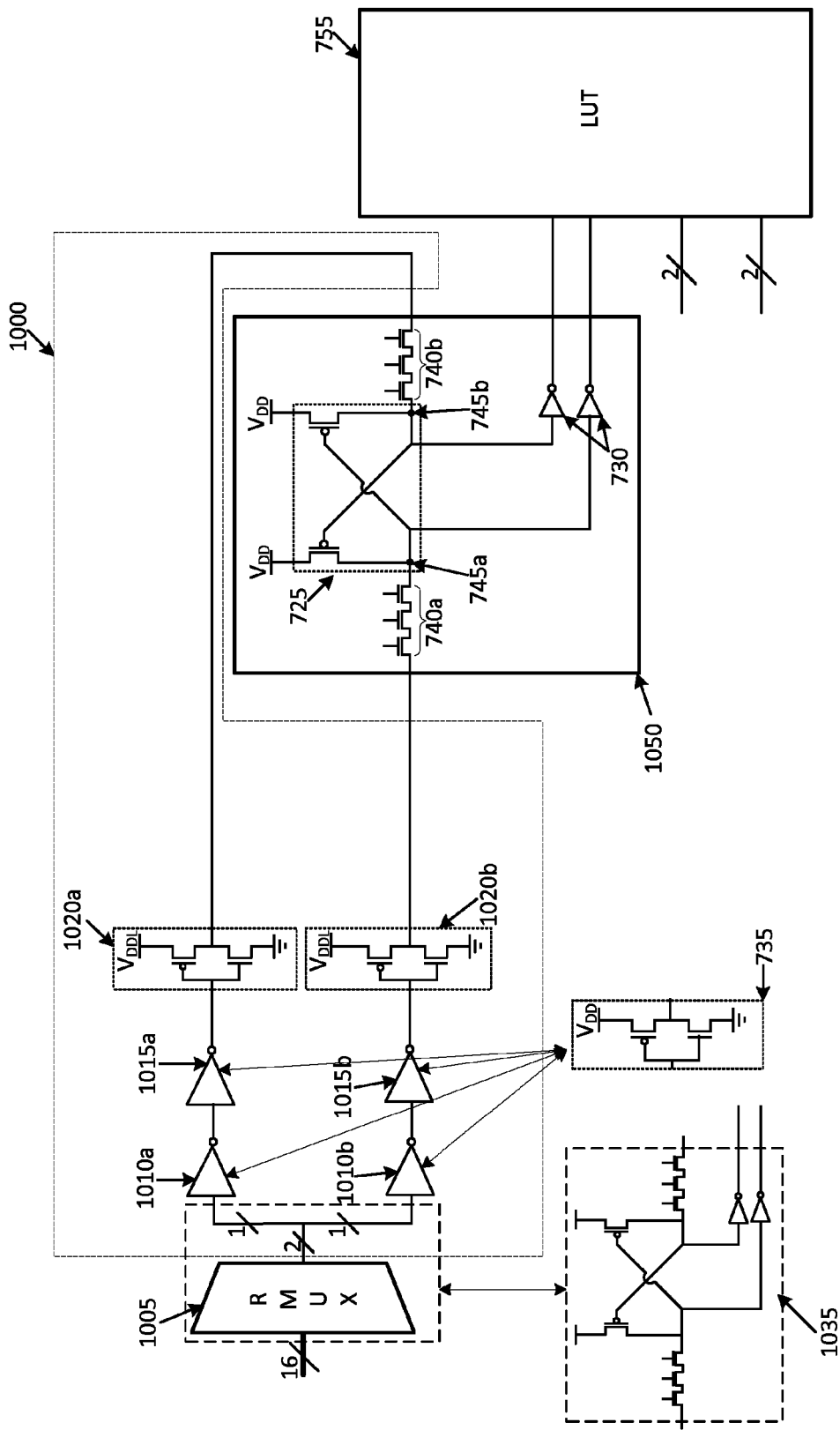
FIGS. 10 and 11 illustrate examples of buffers receiving a lowered voltage in accordance with some embodiments of the invention in which differential signaling is used.

FIG. 10 illustrates another technique for reducing the power consumption of a direct connection 1000 of an IC with configurable RMUXs, IMUXs, and LUTs. As shown in this figure, the direct connection 1000 is implemented as a differential connection (i.e., a connection that passes one logical signal as two complementary physical signals). This direct connection provides the output of a source RMUX 1005 to a destination IMUX circuit 1050, which supplies its output to a LUT 755 that receives input from several other IMUXs. As shown by exploded view 1035, the RMUX 1005 of some embodiments is a physical sixteen-to-two multiplexer that implements a logical eight-to-one multiplexer (i.e., each logical input and output of the logical eight-to-one multiplexer is represented as two corresponding complementary physical inputs and outputs as the physical sixteen-to-one multiplexer).

The IMUX 1050 is identical to the IMUXs 750 and 950 of FIGS. 7 and 9, except the IMUX 1050 does not have the inverter 720b of the IMUX 750 or the NMOS transistor 905 of the IMUX 950. In the IMUX 1050 of FIG. 10, neither the inverter 720b nor the NMOS transistor 950 is needed because the direct connection 1000 between the RMUX 1005 and the IMUX 1050 already supplies a differential signal pair to the IMUX 1050. Like the IMUXs 750 and 950 of FIGS. 7 and 9, the IMUX 1050 of FIG. 10 receives several logical input values (e.g., eight logical input values), even though FIG. 10 illustrates only the logical input value that it receives from the direct connection 1000 in order to simplify this illustration.

Unlike the single-ended direct connection 700 of FIGS. 7 and 9, the differential direct connection 1000 of FIG. 10 includes two sets of wires and buffers to carry each logical signal. One set of wires and buffers passes a "true" signal, while the other set of wires and buffers passes a "complement" signal. Each of these sets of wires and buffers includes three buffers 1010, 1015, and 1020 and four subsets of wires, which (1) provide a single physical signal of output of the RMUX 1005 to the buffer 1010, (2) provide the output of the buffer 1010 to the buffer 1015, (3) provide the output of the buffer 1015 to the buffer 1020, and (4) provide the output of the buffer 1020 to the destination IMUX 1050.

As shown by the exploded view 735, each of the buffers 1010a, 1010b, 1015a, 1015b, 1020a, and 1020b are CMOS inverters formed by stacked PMOS and NMOS transistors that have their gates and their drains tied together. In this figure, the buffers 1010a, 1010b, 1015a, and 1015b are operated at the power supply voltage $V_{DD}$, which is also used to operate the RMUX 1005, the IMUX 1050, as well as other circuits of the IC.

However, to reduce the power consumption of the direct connection 1000, the buffers 1020a and 1020b receive a lower power supply voltage $V_{DDL}$. In some embodiments, this lower power supply voltage $V_{DDL}$ is generated from the power supply voltage $V_{DD}$. In some embodiments, the lower supply voltage $V_{DDL}$ is provided directly by a power supply that is different than the supply that provides the power supply voltage $V_{DD}$.

The buffers 1020a and 1020b use the lowered power supply voltage $V_{DDL}$ to drive signals that they supply to the IMUX 1050. For instance, each of the buffers 1020a and 1020b raises its output to the lowered power supply voltage $V_{DDL}$ when driving a high value onto its output, while maintaining this output at ground when driving a low value onto its output. As further described below, this reduced voltage $V_{DDL}$ at the output of the buffers 1020a and 1020b partially results in the power reduction of these buffers.

Like the IMUXs 750 and 950 of FIGS. 7 and 9, the IMUX 1050 includes a pair of level-converting cross-coupled transistors 725 that allow the IMUX 1050 to handle the low-powered differential outputs (i.e., a true signal and a complement signal) of the buffers 1020a and 1020b after these differential signals pass through the CPL multiplexing transistors 740a and 740b of the IMUX 1050. In some embodiments, the true signal is supplied to the CPL multiplexing transistors 740a, while the complement signal is supplied to the CPL multiplexing transistors 740b.

FIG. 10 illustrates only a part of the CPL multiplexing transistors 740 in order to simplify the circuitry presented in this figure. The CPL multiplexing transistors 740 of the IMUX 1050 can have different implementations in different embodiments. For instance, in different embodiments, the CPL multiplexing transistors 740 have a different number of stages, a different number of transistors, and/or different arrangements for connecting the transistors. One example of these CPL multiplexing transistors 740 was explained above by reference to FIG. 8.

After propagating through the CPL multiplexing transistors 740, signals received by the IMUX 1050 are supplied to the level-converting cross-coupled transistors 725. In other words, a logical low (i.e., a voltage close to ground) is supplied to one PMOS transistor of the set 725, while a logical high (i.e., a voltage close to $V_{DDL}$) is supplied to the other PMOS transistor of the set 725.

The set of cross-coupled transistors 725 quickly pulls one of these two received values to $V_{DD}$, with the other value being pulled to ground through one of the transistor stages 740a or 740b. These two values (i.e., one value at $V_{DD}$ and one value at ground) are supplied to the two buffering inverters 730 that supply their outputs to the LUT 755. This pull-up from $V_{DDL}$ to $V_{DD}$ prevents the performance of the IMUX 1050 from suffering on account of the low power operation of the buffers 1020a and 1020b (i.e., because the reduced voltage is output from the 1020a or 1020b). Additionally, the pull-up serves to quickly amplify the signal so that it is deciphered correctly by the LUT 755 that receives the output of the IMUX 1050.

In FIG. 10, the use of the lowered power supply voltage $V_{DDL}$ (i.e., the operation of the buffers 1020a and 1020b with the lowered power supply voltage $V_{DDL}$) reduces dynamic power consumption ($V_{PS}*V_{swing}$) of the buffers 1020a and 1020b, by reducing the supply voltage $V_{PS}$ received by the buffers 1020a and 1020b and by reducing the voltage swing $V_{swing}$ of the buffers 1020a and 1020b. Specifically, like the buffer 720a of the direct connection 700 of FIG. 7, the $V_{PS}$ of the buffers 1020a and 1020b is reduced from $V_{DD}$ to $V_{DDL}$, while the voltage swing $V_{swing}$ of these buffers is reduced from ($V_{DD}$-$V_{GND}$) to ($V_{DDL}$-$V_{GND}$).

Figure 11:
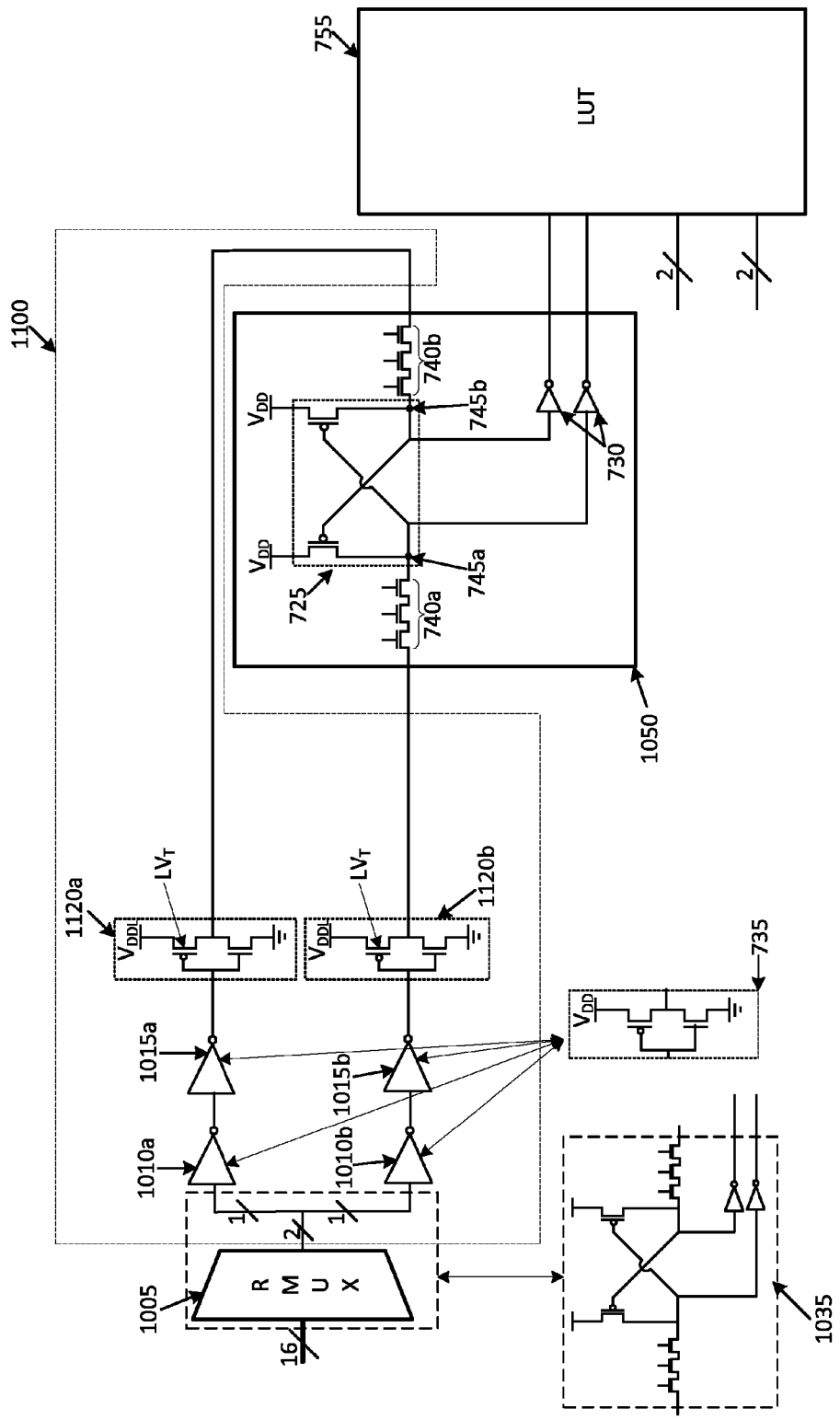

FIG. 11 illustrates a power-saving implementation of some embodiments that is similar to the power-saving implementation illustrated in FIG. 10. However, in FIG. 11, the PMOS transistors of the buffers 1120a and 1120b have been fabricated with an appropriate level of doping to provide a lowered threshold $LV_T$. Like the PMOS transistor of the buffer 720a of FIG. 7, the PMOS transistors of the buffers 1120a and 1120b are "hard off" PMOS transistors that provide fast performance (by virtue of their lowered threshold voltages $LV_T$) while preventing excessive leakage current (by virtue of the "hard off" state). "Hard off" PMOS transistors are further discussed below in Section V.

Figure 12:
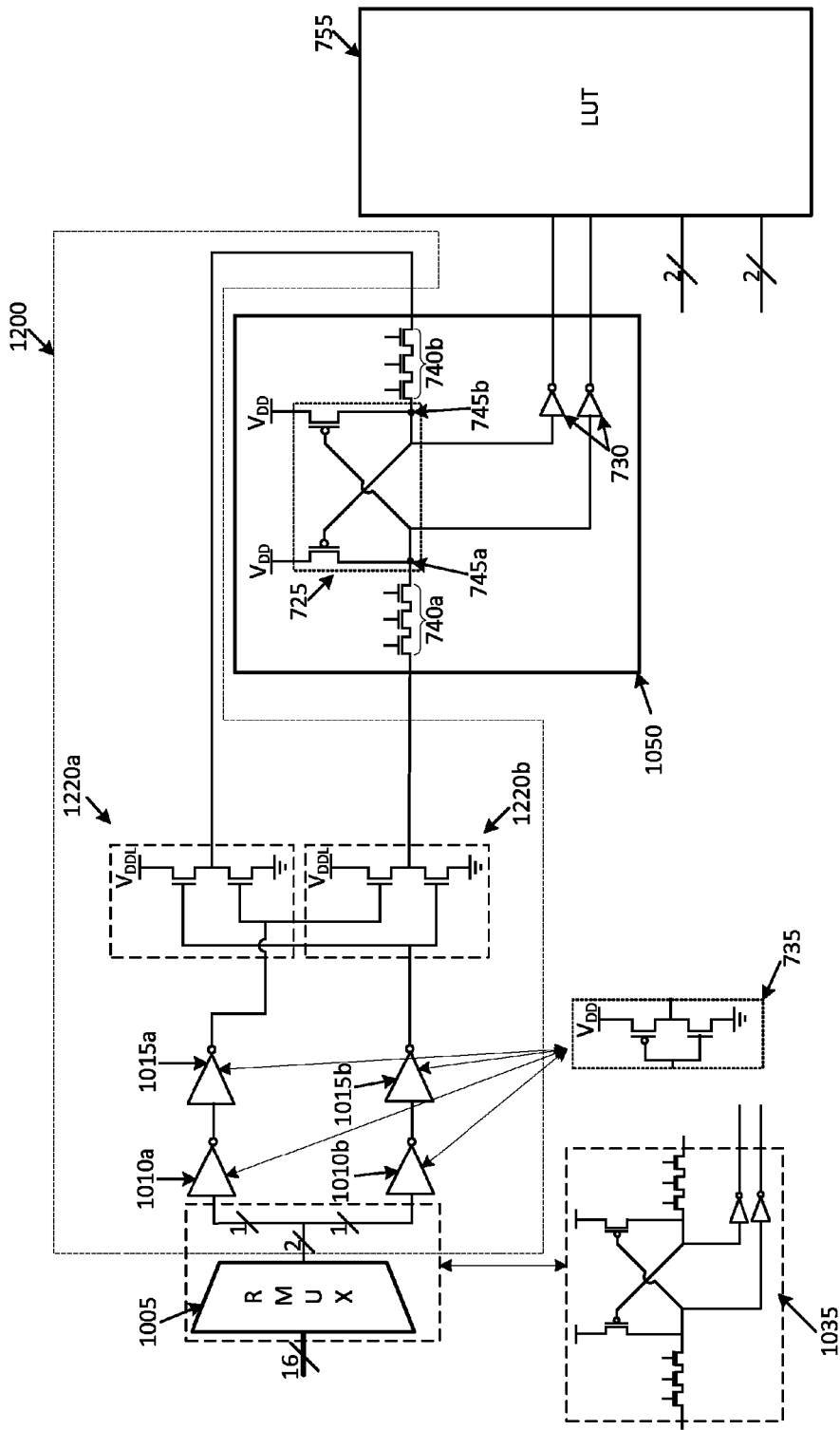
FIG. 12 illustrates an example of buffers with alternate circuitry receiving a lowered voltage in accordance with some embodiments of the invention in which differential signaling is used.

FIG. 12 illustrates another technique that reduces the power consumption of a differential direct connection 1200 that connects two configurable circuits of an IC. Like the differential direct connection 1000 of FIG. 10, the differential direct connection 1200 of FIG. 12 provides output of a source RMUX 1005 to a destination IMUX 1050 as a pair of differential signals (i.e., a physical "true" signal and a physical "complement" signal that together represent one logical signal). Also, like the set of buffers 1020 on the differential direct connection 1000 of FIG. 10, the set of buffers 1220 on the differential direct connection 1200 outputs both the true and the complement signals of the differential signal pair. Furthermore, both buffer sets 1020 and 1220 receive a lowered power supply voltage $V_{DDL}$.

However, in place of the CMOS inverter 720a of the direct connection 700 of FIG. 7, the differential direct connection 1200 of FIG. 12 uses a pair of NMOS-NMOS inverters 1220a and 1220b as buffers. In other words, the buffers 1220a and 1220b each have one NMOS transistor that performs a pull-up operation and one NMOS transistor that performs a pull-down operation. These buffers 1220a and 1220b each receive both differential signals of the differential signal pair that is transmitted on the direct connection 1200.

Using the NMOS-NMOS inverters 1220a and 1220b in place of the CMOS inverters 1020a and 1020b of FIG. 10 does not result in a degradation in performance, even though the voltage of the high signal output by one of the NMOS-NMOS buffers 1220a and 1220b is at $V_{DDL}$ (i.e., an NMOS transistor threshold $V_T$ below $V_{DD}$ in some embodiments). This is because the cross-coupled transistors 725 in the receiving IMUX 1050 use a difference between the two interior nodes 745a and 745b (the difference being due to the difference between the output of one buffer 1020a and the other buffer 1020b that is transferred to the nodes 745a and

745b) to quickly pull the lowered high voltage $V_{DDL}$ from one of the interior nodes 745a and 745b to the $V_{DD}$ rail (the low voltage from the other of the interior nodes 745a and 745b being pulled to the ground rail through one of the transistor stages 740a and 740b).

The use of NMOS-NMOS buffers 1220a and 1220b in conjunction with a lowered power supply voltage $V_{DDL}$, as illustrated in FIG. 12, provides several performance and power-saving advantages. As made apparent by Equation A, reducing a buffer's power supply voltage $V_{PS}$, the buffer's swing voltage $V_{swing}$ (i.e., the difference between the high voltage and the low voltage), or both, reduces the dynamic power consumption of the buffer. Like the buffers 1020 of FIG. 10, the buffers 1220a and 1220b of FIG. 12 are supplied with a lowered power supply voltage $V_{DDL}$, thus lowering $V_{PS}$ from a certain power supply voltage $V_{DD}$ to the lowered power supply voltage $V_{DDL}$. Additionally, the operation at the lowered power supply voltage $V_{DDL}$ results in a lower swing voltage (i.e., $V_{swing}$ is reduced from ($V_{DD}$-$V_{GND}$) to ($V_{DDL}$-$V_G$ND), where $V_{GND}$ is the ground voltage).

The use of NMOS transistors in place of PMOS transistors also yields other advantages in addition to the abovementioned power savings. Because of their higher gain, the NMOS transistors of the buffers 1220a and 1220b can be smaller than the PMOS transistors of CMOS inverters (e.g., one-quarter of the size or smaller). This smaller size reduces the size of the buffers 1220a and 1220b in relation to a CMOS inverter. Furthermore, because the buffers 1220a and 1220b are smaller in some embodiments, they have a lower capacitance. This lower capacitance reduces the load of buffers "upstream" of the buffers 1220a and 1220b, thus resulting in a speed increase (i.e., the switching speed at the output of the upstream buffers 1220a and 1220b is increased).

Figure 13:
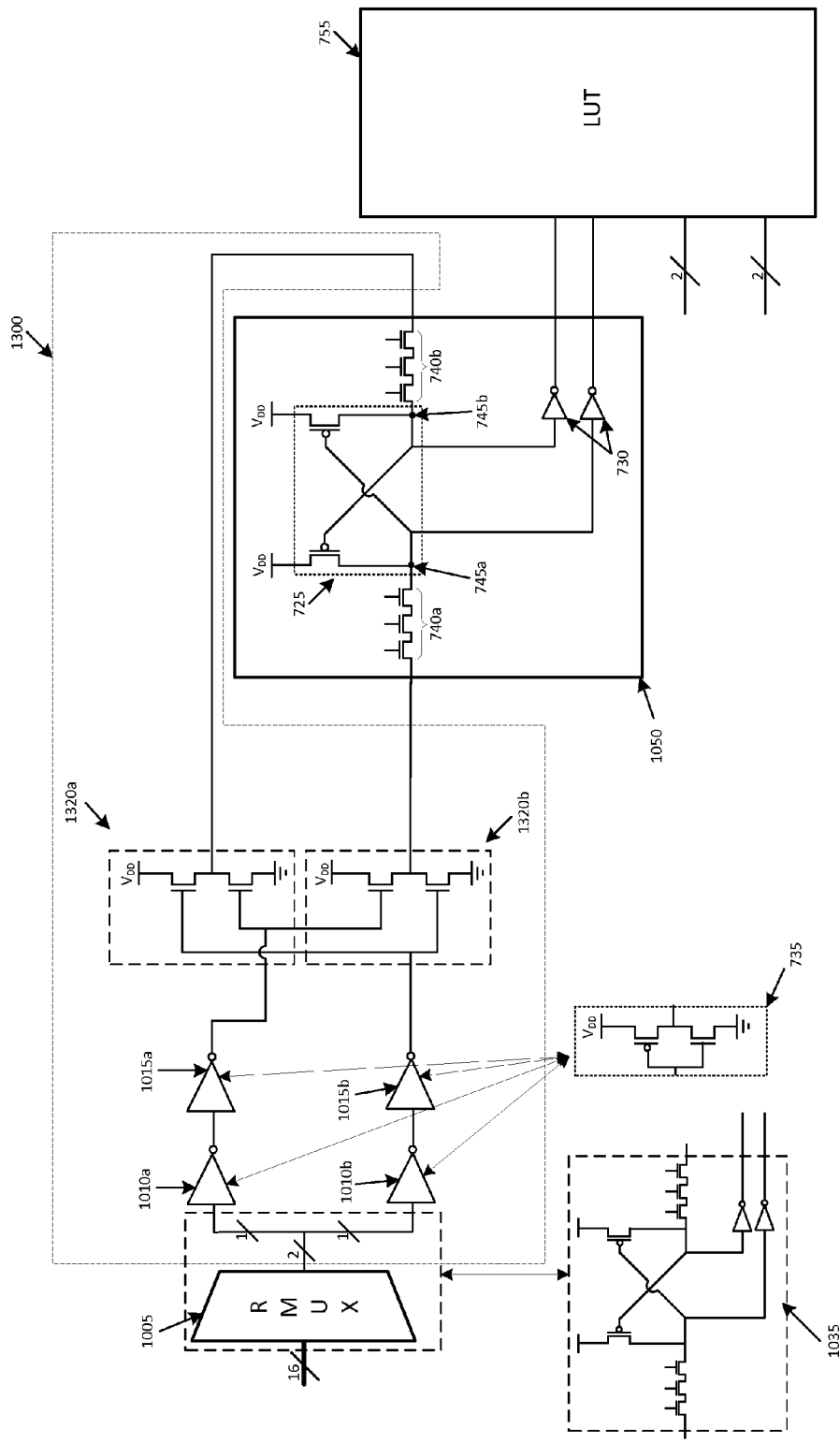
FIG. 13 illustrates an example of buffers with alternate circuitry in accordance with some embodiments of the invention in which differential signaling is used.

FIG. 13 illustrates yet another technique that reduces the power consumption of a differential direct connection 1300 that connects two configurable circuits of an IC. Like the differential direct connection 1200 of FIG. 12, the differential direct connection 1300 of FIG. 13 provides output of a source RMUX 1005 to a destination IMUX 1050 as a pair of differential signals (i.e., a physical "true" signal and a physical "complement" signal that together represent one logical signal). Also, like the set of buffers 1220 on the differential direct connection 1200 of FIG. 12, the buffers 1320a and 1320b on the differential direct connection 1300 are each formed by a pair of NMOS transistors.

However, the buffers 1320a and 1320b of FIG. 13 operate at a different power supply voltage than the buffers 1220a and 1220b of FIG. 12. While the buffers 1220a and 1220b of FIG. 12 operate at a lowered power supply voltage $V_{DDL}$ that is lower than the power supply voltage $V_{DD}$ of other circuits of the IC, the buffers 1320a and 1320b of FIG. 13 operate at the same power supply voltage $V_{DD}$ as other circuits of the IC.

The technique illustrated in FIG. 13 provides several benefits. For instance, the use of these buffers 1320a and 1320b reduces power consumption of the direct connection 1300. As made apparent by Equation A, lowering the swing voltage $V_{swing}$ of a buffer reduces power consumption of the buffer. Because the buffers 1320a and 1320b are made of NMOS transistors as opposed to stacked NMOS and PMOS transistors, the buffers 1320a and 1320b have a lower swing voltage $V_{swing}$. As discussed above with reference to the buffers 1220a and 1220b, this lower swing voltage $V_{swing}$ is caused by a voltage drop across the pull-up transistor of the buffers 1320a and 1320b when outputting a high voltage. The swing voltage $V_{swing}$ of the buffers 1320a and 1320b is therefore ($V_{DD}$-$V_T$-$V_{GND}$), where $V_T$ represents the threshold voltage of the pull-up transistor of each of the buffers 1320a and 1320b.

The operation of these buffers 1320a and 1320b at the power supply voltage $V_{DD}$ of other circuits of the IC eliminates the need for circuitry that produces a lowered power supply voltage $V_{DDL}$ on-chip, or receives a lowered power supply voltage $V_{DDL}$ from a separate off-chip power supply. Eliminating this need for a separate power supply (e.g., an additional power supply in addition to a power supply that supplies $V_{DD}$ to the IC) reduces the burden on users (e.g., a user does not have to purchase an additional power supply), board designers, and package designers. Additionally, like the buffers 1220a and 1220b, buffers 1320a and 1320b may be formed with smaller NMOS pull-up transistors, thus resulting in a performance benefit, as the smaller NMOS transistors have less capacitance than PMOS transistors.

C. Repeaters

The implementation examples above have each described one set of buffers between a sending circuit and a receiving circuit, the most downstream of which operates at a lower voltage $V_{DDL}$. However, some embodiments address the problem of degradation of voltage of signals over long lengths of wire. Such embodiments incorporate one or more repeating buffers (or "repeaters") on a direct connection between two circuits. These repeaters serve to maintain the voltage of signals over long wires. The repeaters regenerate these signals by pulling the signals to the power rails (i.e., $V_{DD}$ and ground) and drive these regenerated signals along another length of wire.

Figure 14:
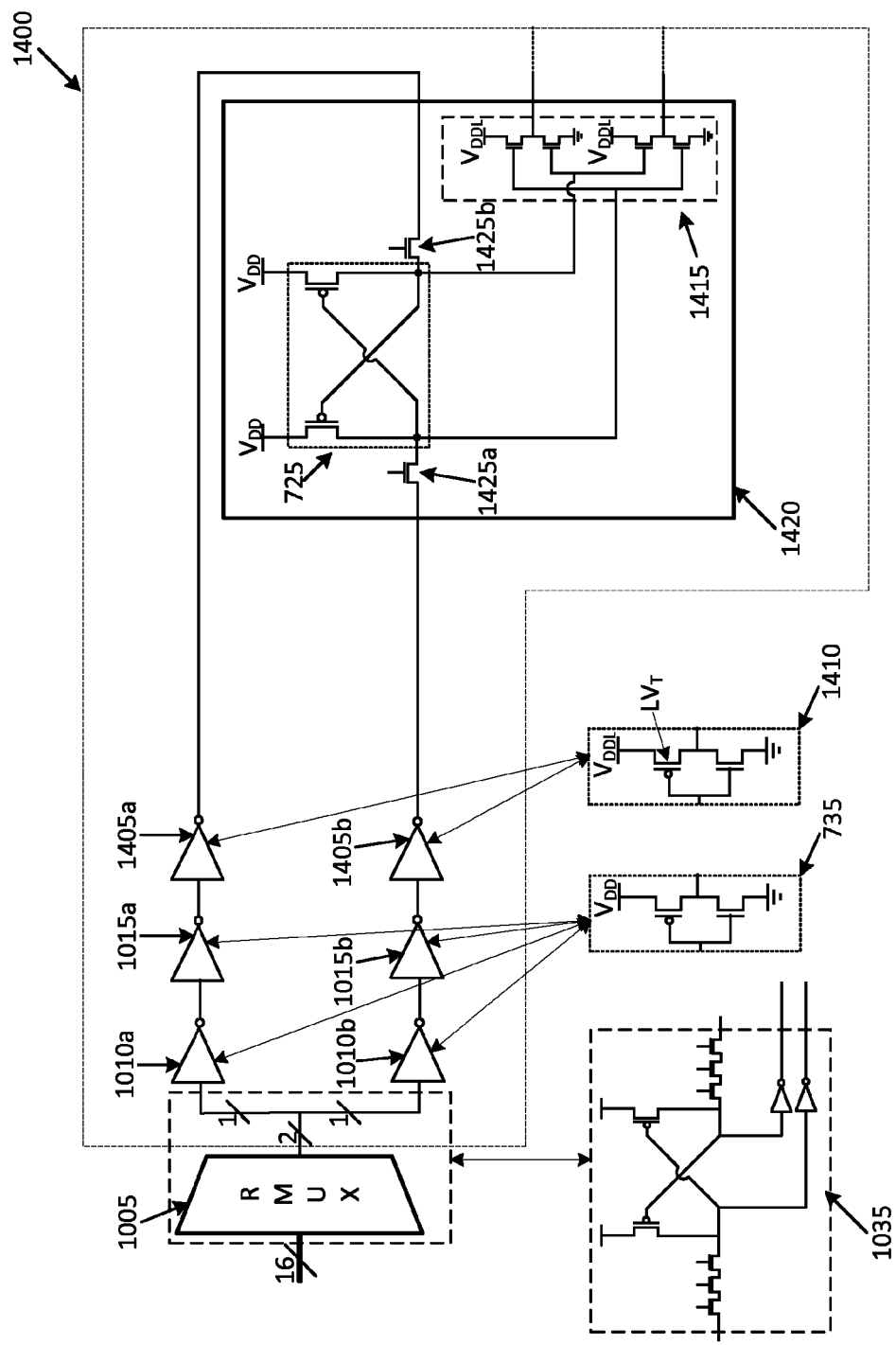
FIG. 14 illustrates an example of a two-stage repeater on a direct connection.

FIG. 14 illustrates an example of a repeater 1420 on a direct connection 1400 that is used to regenerate signals over a long wire. FIG. 14 features much of the same circuitry as described above for several of the figures, including an RMUX 1005 that outputs a differential signal (i.e., one physical "true" signal and one physical "complement" signal that, together, implement a logical signal). This complementary signal may be received by any circuit of the IC (e.g., a LUT, an IMUX, another RMUX, another repeater, etc.; not pictured). This complementary signal is transmitted along a direct connection 1400, a portion of which is shown in the figure. The direct connection 1400 includes a set of buffers that includes buffers 1010a, 1010b, 1015a, 1015b, 1405a, and 1405b. As shown by exploded view 1410, the most downstream buffers 1405a and 1405b of the set of buffers are CMOS inverters. While these downstream buffers may be implemented in different ways in different embodiments (some examples of which are described above), the PMOS transistors of each of the illustrated downstream CMOS inverters 1410 have been fabricated with an appropriate level of doping to provide a lowered threshold voltage $LV_T$.

The direct connection 1400 also includes a repeater 1420. In some embodiments, the repeater 1420 is a two-stage repeater. The first stage regenerates the voltage to $V_{DD}$ (i.e., level converts one physical signal of the differential pair from $V_{DDL}$ to $V_{DD}$) on the differential lines that form the direct connection. Specifically, in the first stage, one of the signals is pulled to ground through a stage of NMOS transistors 1425a or 1425b. The other of the signals is pulled to the power supply voltage $V_{DD}$ by one of the PMOS transistors of a set of cross-coupled PMOS transistors 725. In other words, this first stage serves to pull each of the signals to its respective power rail (i.e., $V_{DD}$ or ground).

The second stage of the two-stage repeater 1420 outputs one of the signals at ground and the other of the signals at the lowered power supply voltage $V_{DDL}$. This is accomplished by a set of buffers 1415 at the output of the repeater 1420. In some embodiments, this set of buffers 1415 is a set of NMOS-NMOS buffers that are powered by the lowered power supply voltage $V_{DDL}$, as described above with reference to FIG. 12. However, one skilled in the art would recognize that a number of different buffers may be used at the output stage to supply output signals at a lowered voltage $V_{DDL}$. For example, a set of NMOS-NMOS buffers that receive a standard supply voltage $V_{DD}$, as described above with reference to FIG. 13, may be used. Other candidates for the set of buffers 1415 include a set of CMOS buffers that receive a lowered power supply voltage $V_{DDL}$ and have a PMOS transistor with a low threshold voltage $LV_T$ as described above with reference to FIG. 11, or any other circuit that outputs a value at a lowered power supply voltage $V_{DDL}$.

Furthermore, although not pictured, the direct connection 1400 may include multiple repeaters 1420. In some embodiments, these multiple repeaters 1420 are also differential two-stage repeaters that first pull the differential signals to their respective power rails (i.e., $V_{DD}$ and ground), and then output one physical signal of the differential signals at $V_{DDL}$ and the other physical signal of the differential signals at ground.

III. Performance and Advantages

Figure 15:
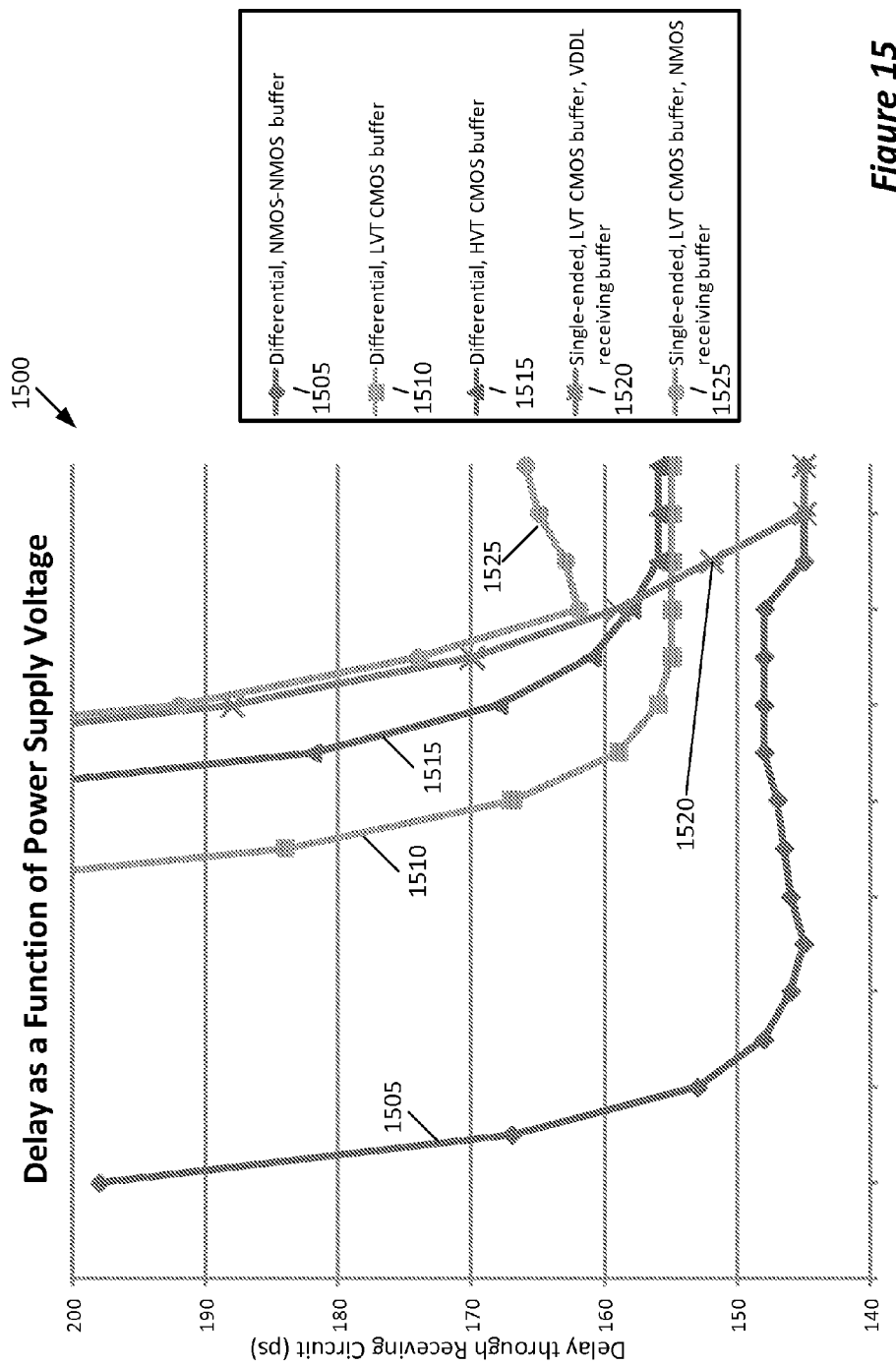
FIGS. 15-17 illustrate simulated performance advantages of various implementations in accordance with some embodiments.
Figure 16:
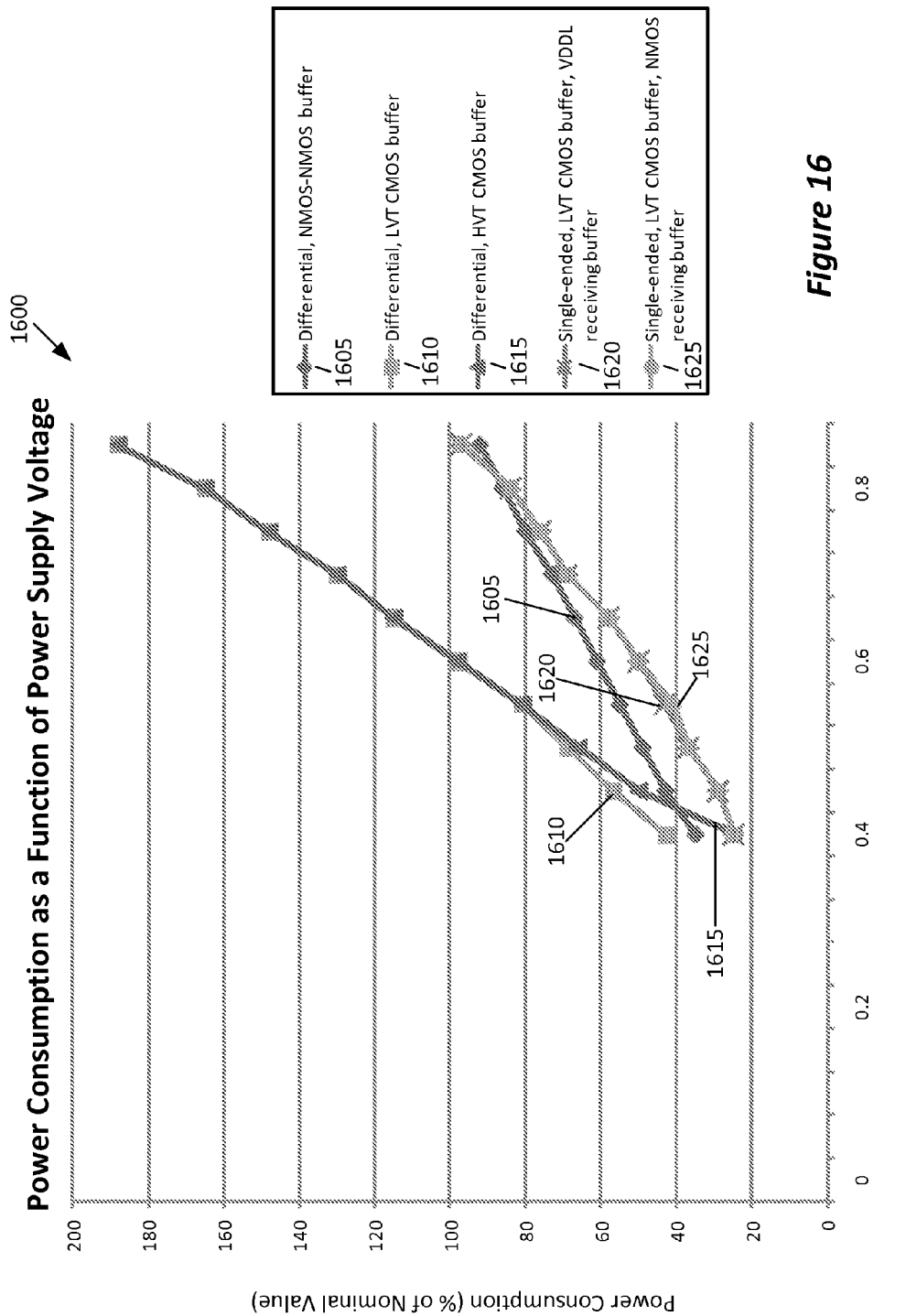
Figure 17:
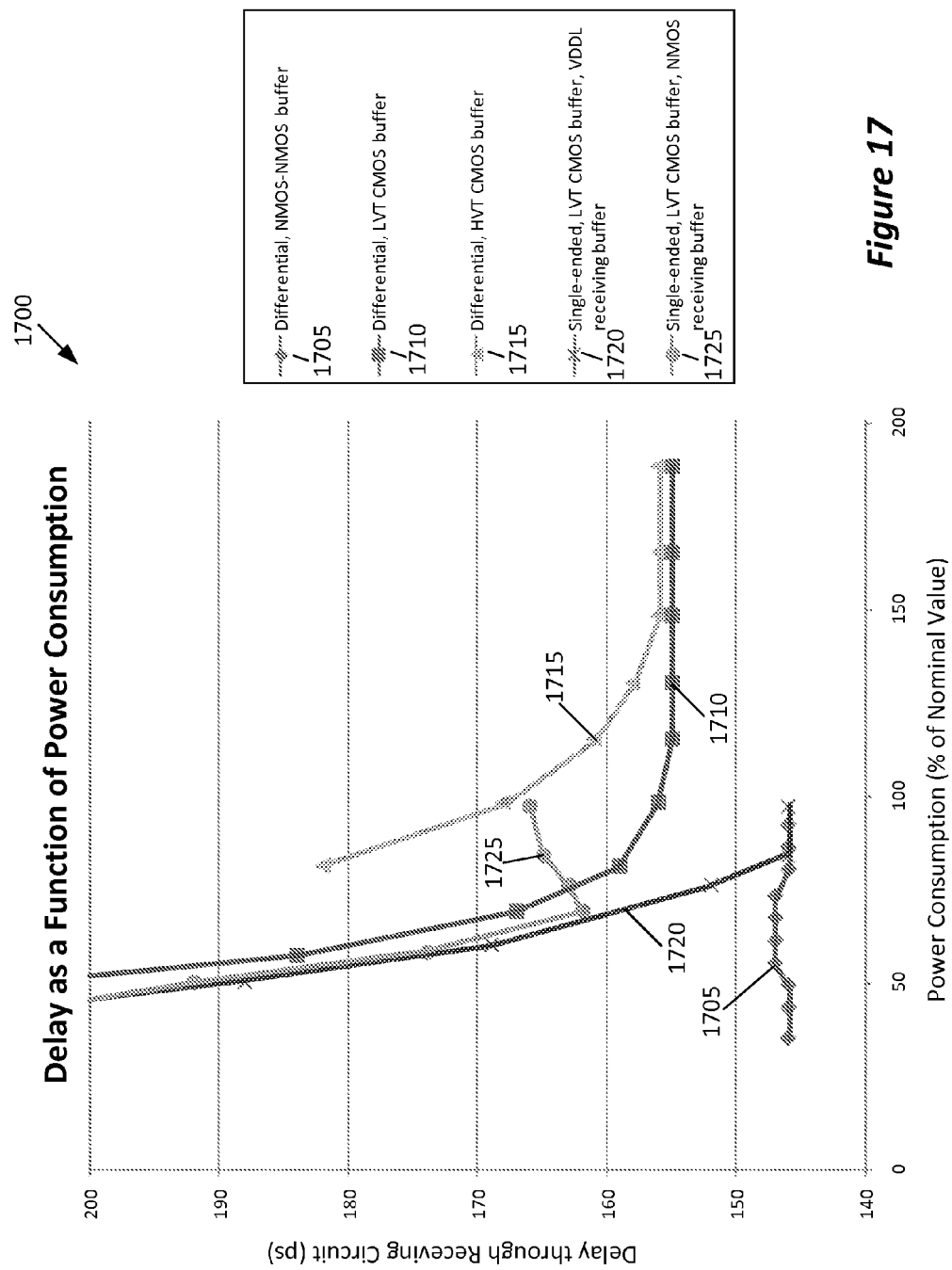

As mentioned above, some embodiments use a lowered power supply voltage $V_{DDL}$ to operate some of the circuits in the interconnects of an IC. Different embodiments utilize different lowered power supply voltages. FIGS. 15-17 present the simulated results of different embodiments that utilize different power supply voltages. Specifically, the presented results illustrate the effects of different lowered power supply voltages $V_{DDL}$ on both power consumption and performance of a direct connection that includes one or more buffers with a lowered power supply voltage $V_{DDL}$.

In these figures, plots 1505, 1605, and 1705 correspond to the differential implementation shown in FIG. 12, in which a set of NMOS-NMOS inverters 1220a and 1220b is supplied a lowered voltage $V_{DDL}$. Plots 1510, 1610, and 1710 correspond to the differential implementation shown in FIG. 11, which features a set of CMOS inverters 1120a and 1120b (1) that are powered by a lowered power supply voltage $V_{DDL}$ and (2) that have low threshold voltage $LV_T$ pull-up PMOS transistors.

Plots 1515, 1615, and 1715 correspond to the differential implementation shown in FIG. 10, which features the same circuitry as FIG. 11, but with standard threshold voltage $HV_T$ PMOS transistors for its CMOS inverters 1020a and 1020b. Plots 1520, 1620, and 1720 correspond to the single-ended implementation described with reference to FIG. 7, in which a CMOS inverter 720a with a low threshold voltage $LV_T$ PMOS transistor receives a lowered power supply voltage $V_{DDL}$ and a receiving IMUX 750 includes a CMOS inverter 720b that is also powered by a lowered voltage supply $VDD_L$. Plots 1525, 1625, and 1725 correspond to the single-ended implementation of FIG. 9, which features the same circuitry as FIG. 7, except the CMOS inverter 720b at the receiving IMUX 750 is replaced with an NMOS transistor 905.

The plots in the graph 1500 of FIG. 15 illustrate the effect of reducing the power supply voltage (expressed in volts) of a direct connection's most downstream buffer on the delay (in picoseconds) of a signal through a receiving circuit (e.g., the IMUX 750 of FIG. 7) that is downstream of the direct connection (e.g., the direct connection 700 of FIG. 7). This graph 1500 shows that, for each implementation, the delay through the receiving circuit increases sharply as voltage is lowered after a certain point. However, the voltage at which the delay begins to sharply increase is different for the different implementations. Plot 1505, which corresponds to the differential implementation of FIG. 12, is shown to exhibit the lowest delay through a receiving circuit for any of the given lowered power supply voltages, as well as the best tolerance for lowered power supply voltages, starting to trend sharply upwards at approximately 0.3V (as opposed to curves for the other implementations, which trend sharply upwards at higher voltages).

The plots in the graph 1600 of FIG. 16 correlate the power supply voltage for driving a direct connection's low-powered buffer with the power consumption of this buffer, which is expressed as a percentage of a control value of dynamic power. Plots 1610 and 1615 show that the implementations described in FIGS. 10 and 11 expend the most power at any given power supply voltage supplied to the buffers 1020 and 1120, respectively. This amount of consumed power can be attributed to the fact that these are differential implementations, and therefore twice the wires and buffers are present as compared to single-ended implementations. However, plot 1605 shows that the power consumed by the differential implementation shown in FIG. 12 is less than that of the other differential implementations of FIGS. 10 and 11. This is attributable, at least partially, to the fact that the NMOS inverters 1220 consume less power than the CMOS inverters 1020a and 1020b of FIG. 10 because of their lower swing voltages $V_{swing}$.

The plots in the graph 1700 of FIG. 17 correlate (a) the delay (in picoseconds) of a signal through a receiving circuit (e.g., the IMUX 750 of FIG. 7) that is downstream of a direct connection (e.g., the direct connection 700 of FIG. 7) with (b) the power consumption of the low-powered buffer of the direct connection. The power consumption is again expressed as a percentage of a control value of dynamic power. In graph 1700, plot 1705 is of particular note. This plot 1705 corresponds to the differential implementation of FIG. 12. This plot 1705 illustrates that the amount of delay through a receiving circuit is shown to be virtually independent on the amount of dynamic power consumed when using the differential implementation NMOS-NMOS inverters 1220a and 1220b. This independence allows the power supply voltage $V_{DDL}$ for these NMOS-NMOS inverters 1220a and 1220b to be very low (e.g., approximately 0.45V) without degrading performance.

IV. Configurable IC with Low Power Interconnects

Figure 18:
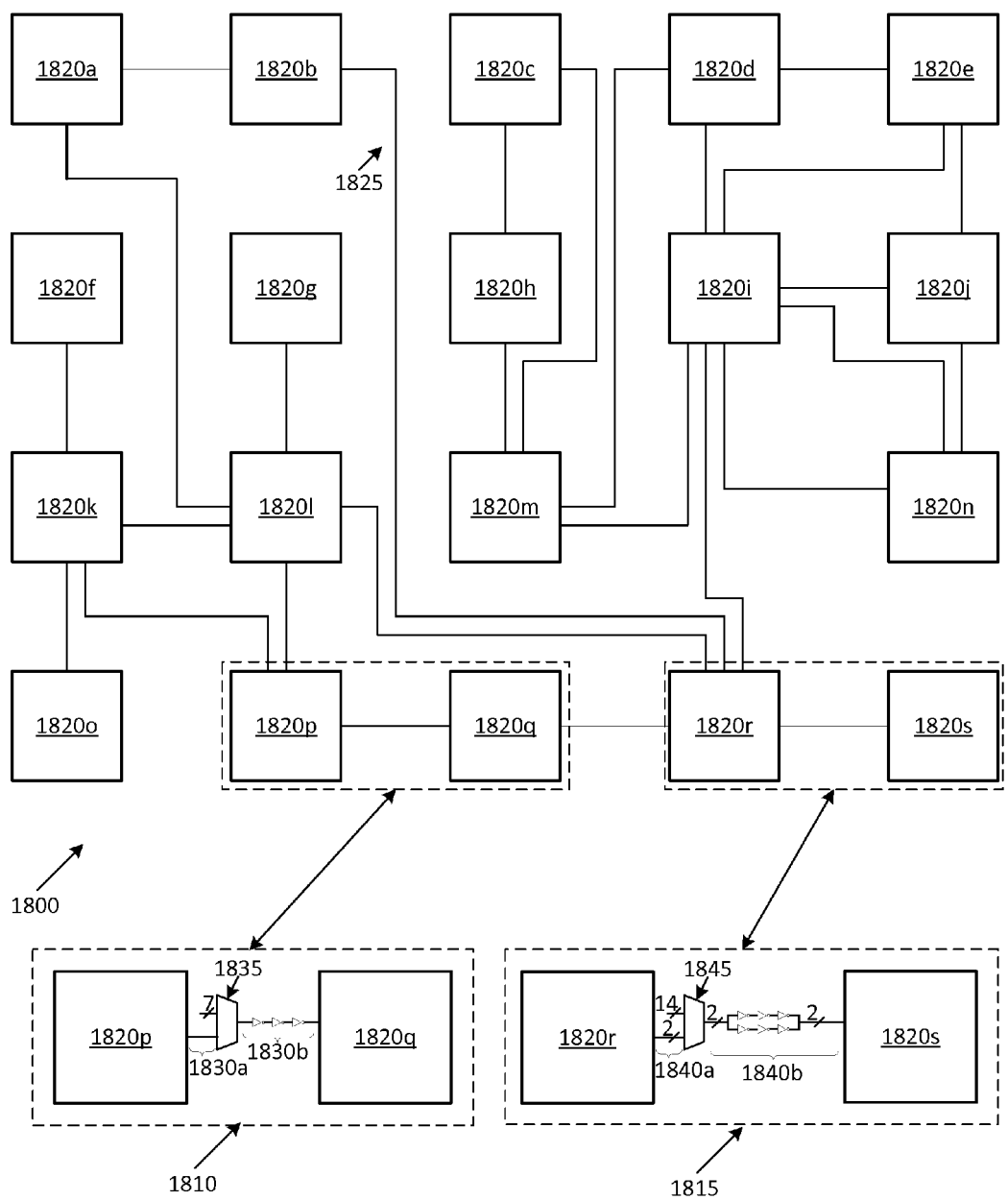
FIG. 18 illustrates an example of an IC in accordance with some embodiments.

FIG. 18 illustrates a configurable IC 1800 that includes several configurable logic circuits 1820a-s and a configurable routing fabric 1825. Some or all of these configurable logic circuits 1820 include a LUT and one or more IMUXs (e.g., three IMUXs for one LUT). The configurable routing fabric 1825 is formed by configurable routing circuits and direct connections. This fabric configurably provides connections (or routing paths) between the configurable logic circuits 1820. A particular configuration of the routing fabric is illustrated in FIG. 18; this configuration is based on a configuration context (a set, or sets, of configuration data) that has been loaded for the configurable routing circuits that form this fabric.

A particular routing path between two logic circuits 1820 in FIG. 18 can be formed by one or more direct connections and/or one or more RMUXs. As further discussed above, the direct connections can include wires, vias, and/or buffers. As shown in exploded views 1810 and 1815 respectively, the direct connections can be implemented in a single-ended manner (i.e., each logical signal is represented by one physical signal) or in a differential manner (i.e., each logical signal is represented by two complementary physical signals). In both single-ended and differential implementations of direct connections, this configurable IC 1800 uses the above described embodiments to reduce the power consumption of the direct connections (i.e., operates some of the buffers of the direct connections with a low power voltage supply and drives some of the wires with this reduced voltage).

More specifically, exploded view 1810 illustrates a path between two configurable logic circuits 1820$p$ and 1820$q$. The path includes two direct connections 1830$a$ and 1830$b$ and an eight-to-one RMUX 1835, which may also receive input signals from other sources (e.g., from other configurable logic circuits or other RMUXs). One of the direct connections 1830$a$ connects one configurable logic circuit 1820$p$ to the RMUX 1835, while the other direct connection 1830$b$ connects the RMUX 1835 to the other configurable logic circuit 1820$q$. Both of the direct connections 1830$a$ and 1830$b$ implement single-ended signaling (i.e., each logical signal is represented by one physical signal). The direct connection 1830$b$ also includes a set of buffers. As described above, some embodiments operate one ore more of these buffers with a lower power voltage supply, thus reducing power consumption of the direct connection 1830$b$.

Exploded view 1815 illustrates another path between two other configurable logic circuits 1820$r$ and 1820$s$. The path includes two direct connections 1840$a$ and 1840$b$ and a sixteen-to-two RMUX 1845, which implements differential signaling (i.e., the sixteen physical inputs represent eight logical inputs, while the two physical outputs represent one logical output). Like the above described RMUX 1835, this RMUX 1845 may receive input from other sources. One of these direct connections 1840$a$ connects one of the configurable logic circuits 1820$r$ to the RMUX 1845, while the other direct connection 1840$b$ connects the RMUX 1845 to the other configurable logic circuit 1820$s$. Both of the direct connections 1840$a$ and 1840$b$ implement differential signaling (i.e., each logical signal is represented by two complementary physical signals). The direct connection 1840$b$ also includes two sets of buffers. As described above, some embodiments operate one ore more of these buffers with a lowered power voltage supply $V_{DDL}$, thus reducing power consumption of the direct connection 1840$b$.

In some embodiments, the configurable IC 1800 is a reconfigurable IC with one or more reconfigurable circuits and configuration memories. A reconfigurable circuit receives different configuration data sets during the operation of the IC that cause the reconfigurable circuit to perform different operations. In some embodiments, a reconfigurable circuit receives different configuration data sets sequentially in an order that loops from the last configuration data set to the first configuration data set. These different configuration data sets are stored in configuration memories that are associated with the reconfigurable circuits. In some embodiments, the reconfigurable IC is a sub-cycle reconfigurable IC, in which different data sets are provided to one or more reconfigurable circuits on a sub-cycle basis (i.e., more than one data set is provided to a reconfigurable circuit during one clock cycle).

V. "Hard off" Fast-Switching Low-Power PMOS Transistors

It is often desirable to use low-threshold, thin-oxide PMOS transistors in circuits that are in the signal path of an IC (e.g., in a configurable circuit that performs a configurable operation of the user design in some embodiments), as these transistors are fast-switching transistors. In some embodiments, a signal path carries data values (e.g., data values that are used to implement a user design of the IC) through the circuits of the IC. The data values carried by a signal path can include input and/or output values of circuits of the IC that are used to perform computation and/or interconnection operations in order to implement the user design.

In some embodiments, the data values carried by the signal path may include configuration data values that configure configurable circuits of the IC (e.g., configurable logic circuits, configurable interconnect circuits, etc.) to perform operations (e.g., computations that are part of the user design). In these embodiments, the signal path may include configuration storage circuitry (e.g., configuration RAM) for storing configuration data values and/or configuration retrieval circuitry for retrieving stored values from the configuration storage circuitry and supplying the configuration data values to one or more configurable circuits. While the data values carried by the signal path of some embodiments include configuration data, the data values carried by the signal path of other embodiments do not include configuration data. In some of these embodiments, the signal path does not include configuration storage and/or retrieval circuitry.

In some embodiments, the data values carried by the signal path do not include power supply values that are used to power circuits of the IC. In some such embodiments, the signal path does not include circuitry that is used to modify (e.g., step down to a lower value) and/or provide power supply values from a power supply to other circuitry of the IC.

Even though it is often desirable to use low-threshold, thin-oxide PMOS transistors, these transistors are not often used because they are prone to leakage current, such as gate and sub-threshold leakage current. Gate leakage current relates to the undesired leakage of current through the gate. Sub-threshold leakage current relates to leakage of current when the transistor is off. In a transistor's "off" state, some current flows from the source to the drain despite the transistor being "off." This type of leakage current is exacerbated by a lower threshold voltage $LV_T$ of the abovementioned PMOS transistors, as the PMOS transistor is "closer" to being turned on in its off state than a PMOS transistor with a standard threshold voltage $SV_T$ (i.e., a threshold voltage that is higher than the lowered threshold voltage $LV_T$) would be. This leakage current is further exacerbated by high temperatures. Accordingly, these low-threshold, thin-oxide PMOS transistors are often used sporadically because their leakage current adversely affects the power consumption of the IC.

Some embodiments of the invention use a reduced power supply voltage to operate low-threshold, thin-oxide PMOS transistors that are used in the signal path of an IC in order to reduce leakage current and thereby improve power consumption of the IC. For instance, as described above by reference to FIGS. 7, 11, and 14, several embodiments utilize low threshold voltage $LV_T$ PMOS transistors in CMOS inverters in the signal path of the IC.

Figure 19:
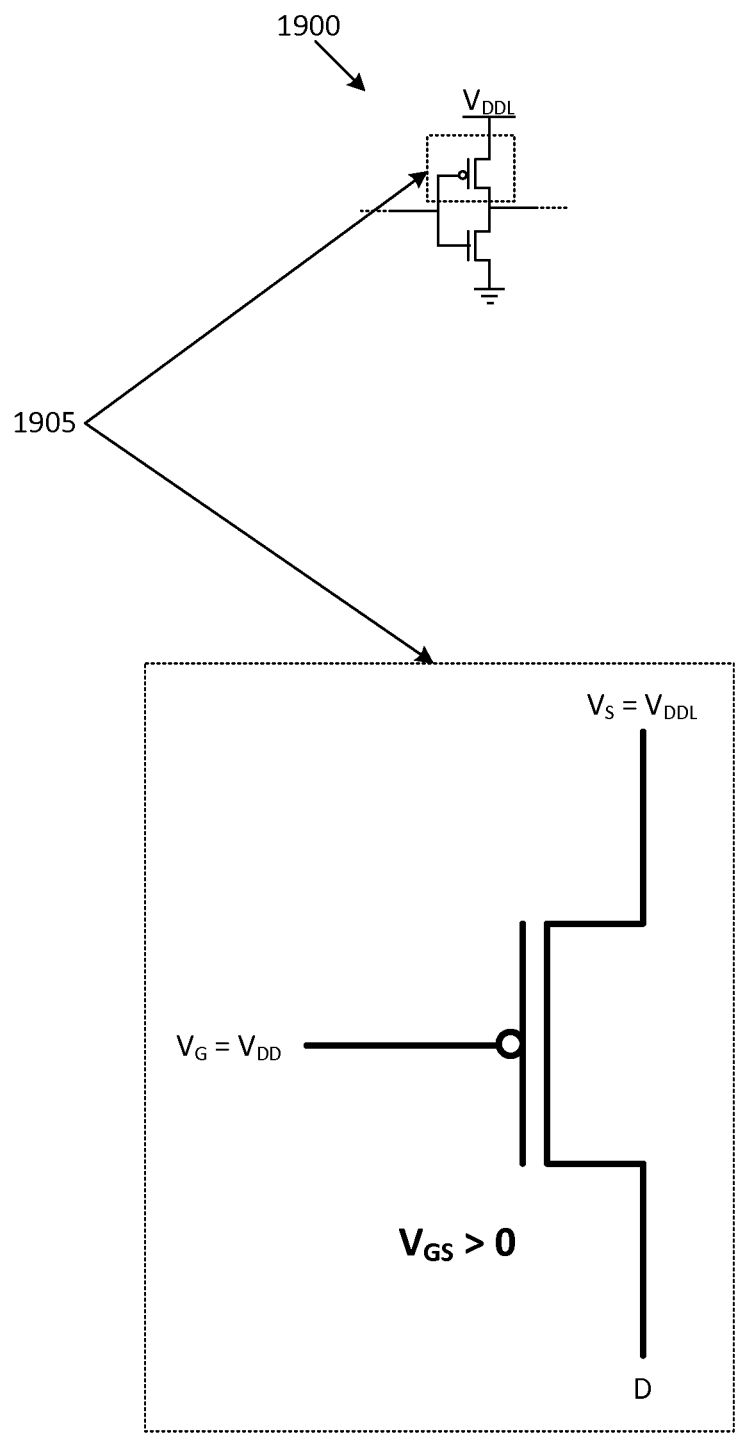
FIG. 19 illustrates a "hard off" PMOS transistor of some embodiments.

FIG. 19 illustrates an example of such a CMOS inverter in the signal path of the IC. As shown in this figure, CMOS inverter 1900 is powered by a lowered supply voltage $V_{DDL}$ that is lower than another power supply voltage $V_{DD}$ that is received by other circuits of the IC (e.g., a CMOS inverter that drives the CMOS inverter 1900). The CMOS inverter 1900 is constructed with a pull-down NMOS transistor and a pull-up PMOS transistor 1905.

Like the pull-up PMOS transistors of the above-referenced power-saving implementations (e.g., with reference to FIGS. 7, 11, and 14), the pull-up PMOS transistor 1905 in FIG. 19 has been fabricated with an appropriate level of doping, such that it has a lowered threshold voltage $LV_T$. This lowered threshold voltage $LV_T$ allows the pull-up PMOS transistor 1905 to switch more quickly than a PMOS transistor that has a standard threshold voltage $SV_T$ (i.e., a threshold voltage that is higher than the lowered threshold voltage $LV_T$). In terms of the operation of the CMOS inverter 1900, the faster switching of the pull-up PMOS transistor 1905 results in a faster-switching inverter 1900.

To reduce leakage current (e.g., "sub-threshold" leakage, as described above) of the PMOS transistor 1905, a reduced power supply voltage $V_{DDL}$ is supplied to the source of this transistor. Accordingly, in the pull-up PMOS transistor's 1905 "off" state, its gate voltage $V_G$ is at a first power supply voltage $V_{DD}$, while its source voltage $V_S$ is at a second, lower power supply voltage $V_{DDL}$. The PMOS transistor's 1905 resulting gate-source voltage $V_{GS}$ in its off state is therefore $V_{DD}$-$V_{DDL}$, which is a positive value (i.e., a value that is greater than zero). Thus, in its off state, the PMOS transistor 1905 is "hard off," as its gate-source voltage $V_{GS}$ is even further away from its threshold voltage $V_T$ than it would be if it had a gate-source voltage $V_{GS}$ of zero. In other words, the gate is "reverse biased" in its off state. This reverse bias (caused by the positive gate-source voltage $V_{GS}$) more strongly prevents current to leak through this transistor (e.g., to leak from its source to its drain) while this transistor is off.

The lower gate-source voltage $V_{GS}$, in concert with a lowered threshold voltage $LV_T$, enables the PMOS transistor 1905 to be faster than a standard PMOS transistor (e.g., a standard threshold voltage $SV_T$ PMOS transistor) that receives a standard power supply voltage $V_{DD}$, while having equivalent or better leakage current characteristics than a standard PMOS transistor (i.e., a PMOS transistor that is powered by a standard power supply voltage $V_{DD}$ and has a standard threshold voltage $SV_T$).

While some embodiments utilize a positive $V_{GS}$ to establish a "hard off" state of a PMOS transistor that has a low threshold voltage $LV_T$, other embodiments use this "hard off" state to reduce leakage current of other types of PMOS transistors. For instance, this "hard off" concept can be applied to PMOS transistors with different threshold voltages (e.g., standard threshold voltages $SV_T$) or different oxide thicknesses (e.g., mid- and thick-oxides).

Moreover, even though the above described embodiments show PMOS transistors of CMOS inverters as the transistors that are turned off hard by the reduced power supply voltage $V_{DDL}$, one of ordinary skill will realize that other PMOS transistors that are in the signal path in other circuit arrangements can be turned off hard by supplying a reduced power supply voltage $V_{DDL}$ to them. Specifically, in some embodiments, these "hard off" PMOS transistors are components of any other type of circuit of an IC (e.g, any circuit in a signal path of a user design, any circuit in a core of an IC, any circuit that includes thin-oxide transistors, etc.). Furthermore, while such "hard off" PMOS transistors may be used in configurable ICs (i.e., ICs that include configurable circuits) in some embodiments, "hard off" PMOS transistors may also be used in any type of IC (e.g., non-configurable ICs such as application-specific integrated circuits, or "ASICs," etc.) in order to provide PMOS transistors that do not experience excessive leakage current.

The preceding discussion described some embodiments that reduce power consumption of an IC by using a reduced power supply voltage to turn off hard a low-threshold, thin-oxide PMOS transistors in circuits of a signal path of the IC. Section VI below provides several examples for supplying and/or generating reduced power supply voltages for an IC.

VI. IC Receiving and/or Generating Multiple Voltages

A. Core Circuitry

Some embodiments of the above described examples are performed by circuits within the core of an IC (also referred to as core circuitry). Core circuitry of an IC in some embodiments is distinct from the IC's I/O circuitry, which through one or more interface interconnects (e.g., pins, solder balls, etc.) communicates with one or more circuits outside of the IC to input data (e.g., data used in implementing a user design of the IC) into the IC and/or output data from within the IC to the outside of the IC. In other words, core circuits of some embodiments do not directly communicate with the "outside world" (i.e., core circuits of some embodiments only send and receive signals to other circuits of the IC).

In some embodiments, core circuits are circuits that are in the IC's signal paths that are used to implement a user design, as described above. As such, core circuits of an IC can include configurable logic circuits (e.g., configurable LUTs), configurable interconnect circuits (e.g., configurable RMUXs), non-configurable circuits (e.g., memories), etc. The core of the IC may also include direct connections (i.e., wires, vias, and buffers) between these circuits.

Core circuitry of an IC in some embodiments is made up of transistors that have thinner oxides than the transistors that make up non-core (e.g., I/O) circuitry. The core circuits of some embodiments include transistors with the thinnest oxides that are used to make any transistor on the IC. Some embodiments use mid- and thick-oxide transistors for non-core (e.g., I/O) circuitry, while using thin-oxide and, at times, mid-oxide transistors in core circuitry in some embodiments. The thin oxides of the core transistors allow these transistors to switch faster than mid- and thick-oxide transistors. Oxide thickness is also tied to current leakage of a transistor (i.e., the thinner the oxide of a transistor, the more leakage current it generally experiences).

Each of these three transistor types (i.e., thin-, mid-, and thick-oxide transistors) has a different maximum voltage that is specified for the transistor type. In some embodiments, the maximum voltage for a particular transistor type is the largest voltage that can be supplied to the transistor without creating the risk of damaging the transistor. Typically, a foundry that fabricates the IC defines the maximum voltage for each of the transistor types that are manufactured on the IC.

In some embodiments, transistors of core circuitry (e.g., thin-oxide transistors) receive a core voltage V., which is the lowest maximum voltage for these transistor types (e.g., approximately 0.9V today). The core voltage $V_{core}$ of some embodiments is the lowest voltage supplied to the IC. As further described below, different core circuitry of an IC of some embodiments may receive multiple different voltages. Mid-oxide transistors are capable of handling an intermediate amount of maximum voltage (e.g., approximately 1.6V today), while thick-oxide transistors are capable of handling the highest maximum voltage of any transistor of an IC (e.g., approximately 2.5V today). It is expected that the maximum voltage levels will drop as the thickness of the oxides of the transistors is reduced.

In some embodiments, core circuits are made up of transistors that have polysilicon gates with smaller dimensions (i.e., width and length of the gates) than transistors that make up non-core (e.g., I/O) circuitry. The transistors of core circuitry of some embodiments have gates with the smallest dimensions of the gates of any transistor of the IC.

In order to operate, a transistor's charge density must remain below a maximum level. Generally, the larger the gate dimensions of a transistor, the higher the voltage at which the transistor can operate and keep the charge density (i.e., the ratio of voltage at which the transistor operates to the area of the gate of the transistor) below the maximum level. Thus, the larger the gate dimensions of a transistor, the higher the voltage at which the transistor is able to operate. As such, core transistors (which have smaller gates than other transistors in some embodiments) are generally able to operate at a lower maximum voltage $V_{core}$ than other transistors of the IC (e.g., transistors of I/O circuitry), as discussed above.

Figure 20:
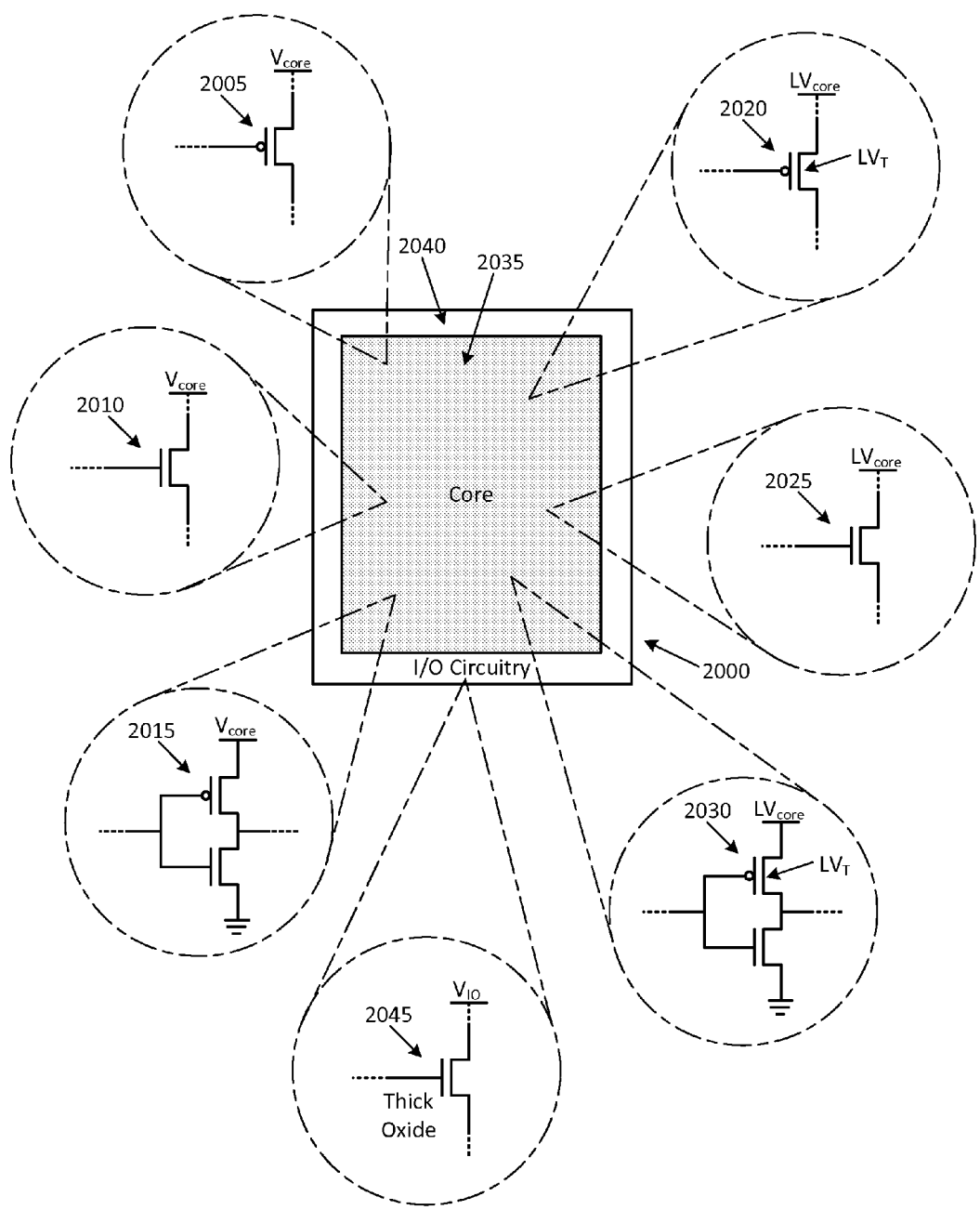
FIG. 20 illustrates different transistor types in the core of an IC.

As mentioned above, an IC may include many different variations on thin-, mid-, and thick-oxide transistors. FIG. 20 illustrates some examples of some such different variations in an IC 2000. The IC 2000 includes a core 2035 and I/O circuitry 2040 (i.e., non-core circuitry in some embodiments). The core 2035 of the IC 2000 may include several variations of thin-oxide transistors, including a PMOS transistor 2005 that receives a core voltage $V_{core}$ (e.g., 0.9V), an NMOS transistor 2010 that receives $V_{core}$, a PMOS transistor 2020 that receives a voltage below the core voltage $LV_{core}$ (e.g., 0.45V) and has a lowered threshold voltage $LV_T$, and/or an NMOS transistor 2025 that receives $LV_{core}$. In some embodiments, these various transistor types are used to form several different circuits, such as CMOS inverters 2015 and 2030. One skilled in the art would recognize that several other core transistor types that have not been mentioned may also be present in the core 2035 (e.g., thin-oxide PMOS transistors or thin-oxide NMOS transistors with intermediate/standard or high threshold voltages $SV_T$ or $HV_T$).

The I/O circuitry 2040 of the IC 2000 also includes one or more transistor types. For instance, the I/O circuitry 2040 may include a thick-oxide NMOS transistor 2045 that is powered by $V_{IO}$ (e.g., 2.5V), which is a higher voltage than both $V_{core}$ and $LV_{core}$. In some embodiments, the I/O circuitry 2035 may also include other mid- and thick-oxide transistors (not shown). For instance, the I/O circuitry 2035 may include thick-oxide PMOS transistors, mid-oxide PMOS transistors, mid-oxide NMOS transistors, etc. As described below, these different voltages may be provided by more than one power supply.

B. Multiple External Power Supplies

Figure 21:
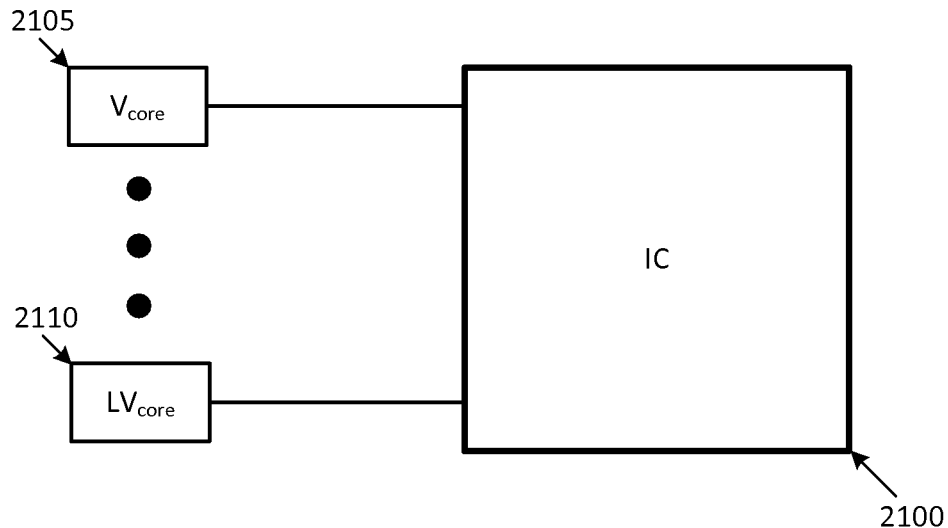
FIG. 21 illustrates an IC that receives a core voltage and a voltage that is less than the core voltage.

Some embodiments of the invention provide multiple different power supply voltages to an IC. In some such embodiments, the IC receives one external voltage that is $V_{core}$ and another external voltage $LV_{core}$ that is less than $V_{core}$. FIG. 21 illustrates an IC 2100 that receives two such voltages. The IC 2100 is a configurable IC in some embodiments, while in other embodiments, the IC 2100 might be any other type of IC (e.g., an ASIC, a processor, etc.).

As shown in FIG. 21, the IC 2100 receives multiple voltages, two of which are (1) a core voltage $V_{core}$ and (2) a voltage below the core voltage $LV_{core}$. In some embodiments, a first external power supply 2105 (i.e., a power supply that is external to the IC) supplies the core voltage $V_{core}$ to the IC, while a second external power supply 2110 supplies the voltage below the core voltage $LV_{core}$ to the IC. As mentioned above, the core voltage $V_{core}$ is the voltage that is intended for the core of the IC (e.g., the core voltage $V_{core}$ is typically equal to the lowest maximum voltage specified for the core transistors of the IC).

In some embodiments, the core voltage $V_{core}$ is the power supply voltage $V_{DD}$ referred to in the above figures, while the voltage below the core voltage $LV_{core}$ is the lowered power supply voltage $V_{DDL}$ referred to in the above figures. In some embodiments, the IC 2100 receives these two voltages concurrently (i.e., at a given point in time, both external power supplies 2105 and 2110 supply power to the IC 2100). In some embodiments, the IC 2100 and one or more of these external power supplies 2105 and 2110 are physically located on the same device. In other embodiments, one or more of these external power supplies is physically located in a different device than the IC 2100 and/or the other external power supply.

Figure 22:
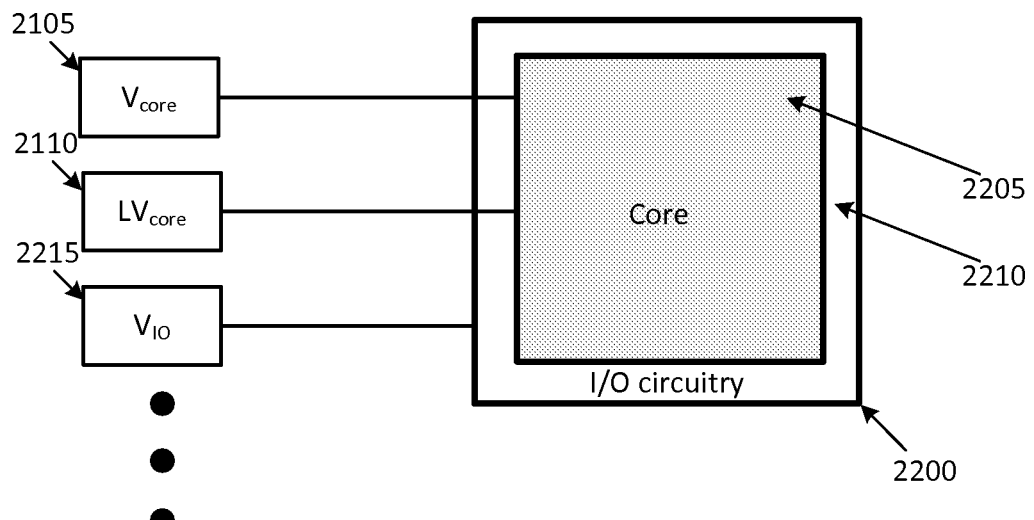
FIG. 22 illustrates an IC receiving two core voltages and an I/O voltage.

FIG. 22 illustrates another example of several power supplies providing power supply voltages to an IC 2200, which again might be a configurable IC or another type of an IC. The IC 2200 includes a core 2205 and I/O circuitry 2210. The core 2205 is supplied with a core voltage $V_{core}$ from a first power supply 2105 and a voltage below the core voltage $LV_{core}$ from a second power supply 2110. The I/O circuitry is supplied an I/O voltage $V_{IO}$ by a third power supply 2215. In some embodiments, the I/O voltage $V_{IO}$ is higher than the core voltage $V_{core}$ (e.g., 2.5V as opposed to 0.9V, in some embodiments). In some embodiments, the I/O circuitry is supplied two or more different voltages from two different power supplies in order to supply voltages transistors of different oxide thicknesses (e.g., mid-oxide I/O transistors would receive a $V_{IO}$ of 1.6V, while thick-oxide transistors would receive a higher I/O voltage $HV_{IO}$ of 2.5V).

C. Core Transistors in the Signal Path Receiving Different Voltages

As mentioned above, some embodiments provide different power supply voltages to core transistors in the signal path of a design that is implemented by the IC. In some such embodiments, at least one of the provided power supply voltages is less than the core voltage $V_{core}$. The different power supply voltages can be supplied from the outside of the IC, and/or can be generated inside of the IC, as further described below.

Figure 23:
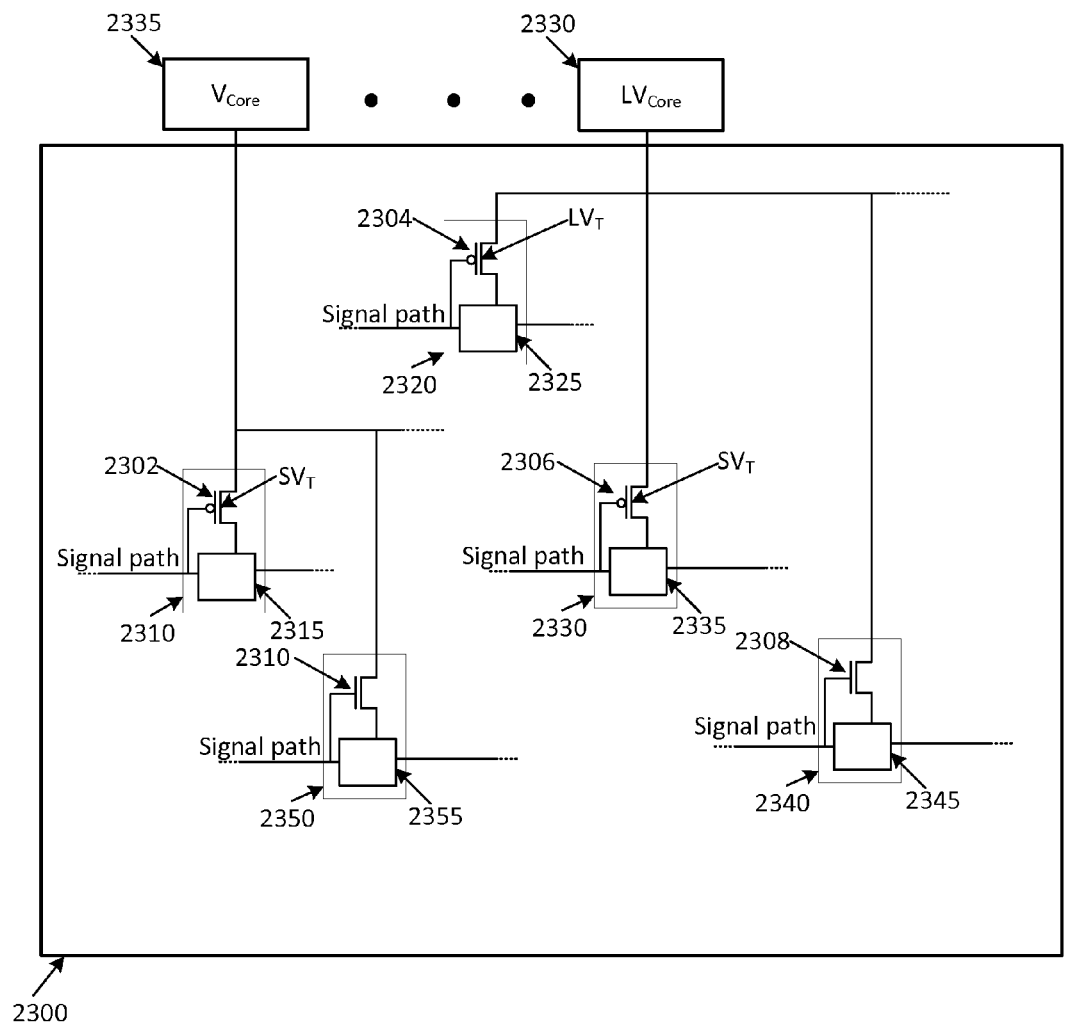
FIG. 23 illustrates an IC with transistors that receive both a core voltage and a voltage that is less than the core voltage.

For instance, FIG. 23 illustrates an IC 2300 in which core transistors of the IC receive different power supply voltages from two different power supplies 2330 and 2335. One power supply 2335 supplies a core voltage $V_{core}$ to the IC, while the other power supply 2330 supplies a voltage $LV_{core}$ that is lower than the core voltage $V_{core}$ to the IC. In some embodiments, the IC 2300 may also receives power from other power supplies in some embodiments (e.g., one or more I/O voltages $V_{IO}$ that are each higher than the core voltage $V_{core}$), as described above by reference to FIG. 22.

In the example illustrated in FIG. 23, the core transistors include transistors 2302, 2304, 2306, 2308, and 2310 that are part of circuits 2310, 2320, 2330, 2340, and 2350, respectively. Each of these core transistors is part of the signal path of the design implemented by the IC, as each of these transistors receives a design data value (e.g., an input value, an output of another circuit in the signal path, a stored data value, a configuration value, etc.) at its gate, as shown in FIG. 23.

The low-threshold PMOS transistor 2304, the standard-threshold PMOS transistor 2306, and the NMOS transistor 2308 receive the lower core power supply voltage LV., while the standard-threshold PMOS transistor 2302 and the NMOS transistor 2310 receive the standard core power supply voltage $V_{core}$. Although FIG. 23 illustrates these transistors as receiving $LV_{core}$ and $V_{core}$ directly from the outside of the IC, one of ordinary skill in the art will realize that these voltage values will be passed through one or more stages of circuits in the IC before reaching these transistors in some embodiments.

The circuits 2310, 2320, 2330, 2340, and 2350 of the IC 2300 may be one of myriad circuits, including CMOS inverters, NMOS-NMOS inverters, configurable circuits (e.g., a configurable LUT, a configurable IMUX, a configurable RMUX, etc.), storage elements, etc. In FIG. 23, the only portion of the circuits 2310, 2320, 2330, 2340, and 2350 that are shown are the relevant transistors for this discussion; the remaining circuitry is represented by the boxes 2315, 2325, 2335, 2345, and 2355. In this example, each of the circuits 2310, 2320, 2330, 2340, and 2350 receives one or more input signals and supplies one or more output signals along the signal path based on the received input signals.

D. On-Chip Generation of Different Voltages

Figure 24:
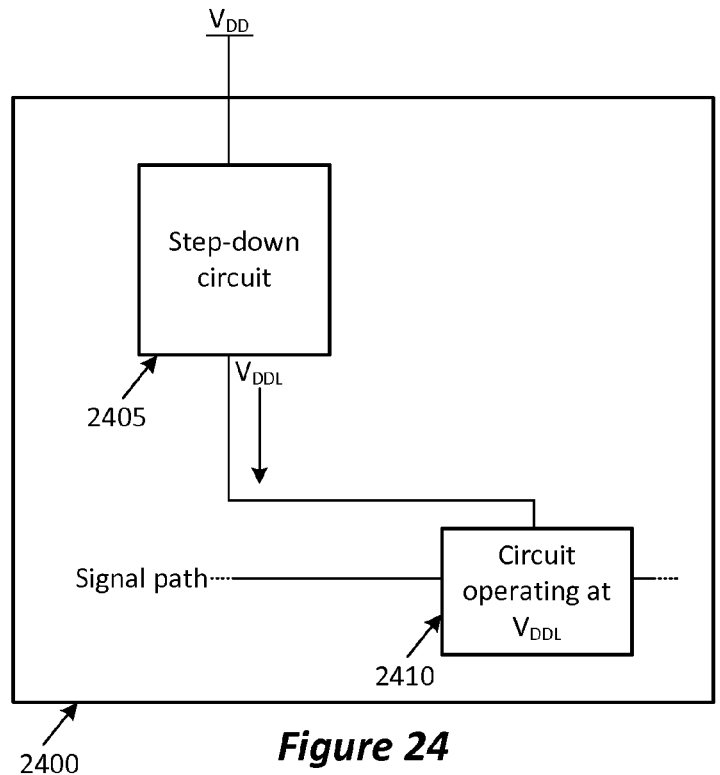
FIGS. 24 and 25 illustrate examples of voltage being stepped down within an IC.

FIG. 24 illustrates that, while different voltages may be supplied by different power supplies, some embodiments generate some or all of the power-supply voltages on-chip. In this figure, a power supply supplies a voltage $V_{DD}$ from outside of an IC 2400. A step-down circuit 2405 of the IC receives this power supply voltage $V_{DD}$ and outputs a lowered power supply voltage $V_{DDL}$. A circuit 2410 that operates at the lowered power supply voltage $V_{DDL}$ receives this lowered power supply voltage $V_{DDL}$. In some embodiments, the circuit operating at $V_{DDL}$ 2410 is within the core of the IC 2400 and is in a signal path of a design implemented by the IC.

Figure 25:
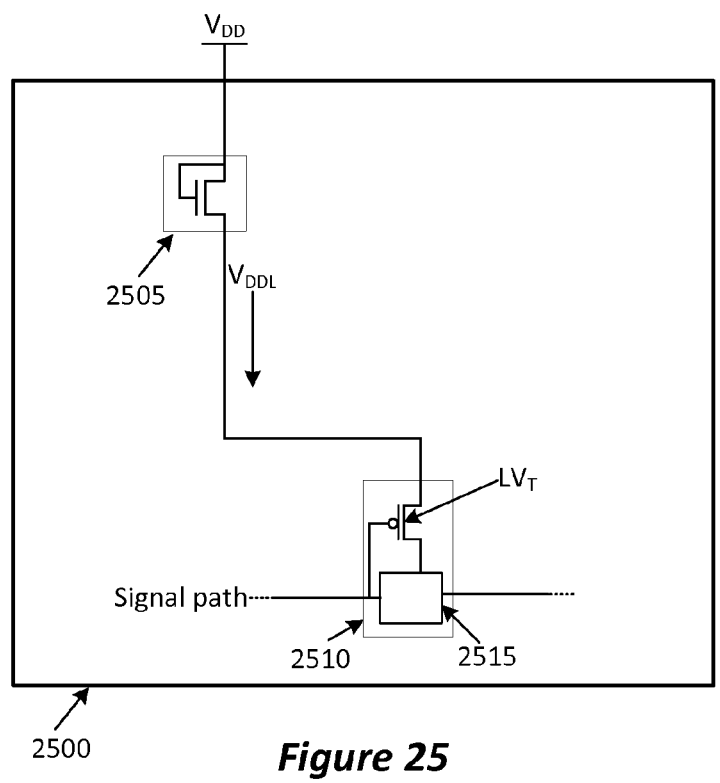

FIG. 25 illustrates an example of some specific circuitry in an IC 2500 that implements the step-down circuit 2405 and the circuit operating at $V_{DDL}$ 2410 illustrated in the above FIG. 24. In FIG. 25, the step-down circuit 2505 is implemented as an NMOS transistor with its drain tied to its gate. This causes the voltage $V_S$ at the NMOS transistor's source terminal to be at a lowered voltage $V_{DDL}$ (i.e., $V_{DD}$ minus the threshold voltage $V_T$ of the NMOS transistor 2505), thus supplying $V_{DDL}$ to the circuit 2510 that operates at the lowered voltage $V_{DDL}$. While described in this figure as an NMOS transistor with its drain tied to its gate, the step-down circuit 2505 may be any circuit that receives a first power supply voltage $V_{DD}$ and outputs a lowered power supply voltage $V_{DRL}$.

The circuit 2510 that is powered by the lowered power supply voltage $V_{DDL}$ includes a PMOS transistor with a lowered threshold voltage $LV_T$. The circuit 2510 also includes other components 2515. In some embodiments, the circuit 2510 is a CMOS inverter. In some of these embodiments, the other components 2515 include an NMOS transistor and a ground. In some embodiments, the circuit 2510 is in the core of the IC 2500. In some embodiments, the circuit 2510 is in the signal path of a user design of the IC, as it receives one or more input signals and supplies one or more output signals on the signal path based on the received input signals.

Figure 26:
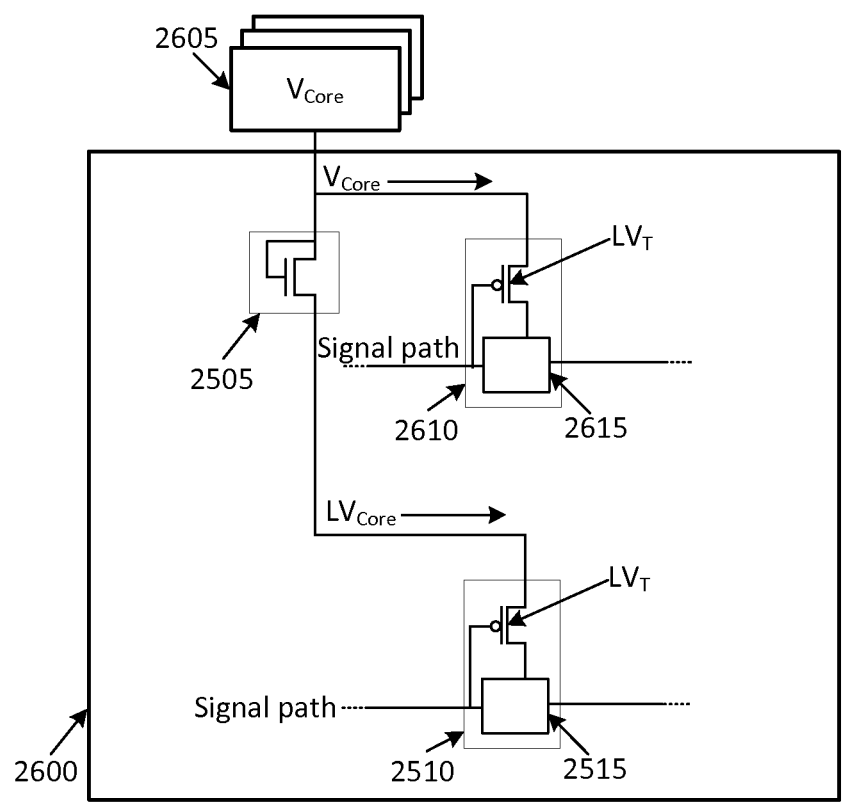
FIG. 26 illustrates an example of an IC with one set of transistors that receive an externally generated voltage and another set of transistors that receive an internally stepped down voltage.

FIG. 26 illustrates an example of an IC 2600, in which some circuitry receives (1) a core voltage $V_{core}$ that is provided from outside of the IC, and (2) a lowered core voltage $LV_{core}$ that is generated within the IC. The IC 2600 is powered by one or more external power supplies, including a particular external power supply 2605. The external power supply 2605 supplies the core voltage $V_{core}$ to certain transistors of the IC 2600. The IC 2600 includes a voltage step-down circuit 2505 and two other circuits 2510 and 2610.

Circuit 2510, as described above with respect to FIG. 25, is powered by the lowered core voltage $LV_{core}$ that is generated by the step-down circuit 2505. On the other hand, the other circuit 2610 receives power from the external power supply (possibly through one or more intervening circuits) that supplies the core voltage $V_{core}$. In other words, the voltage that powers this circuit 2610 is not reduced by a circuit of the IC that is intended to step down an externally supplied voltage to an internally generated lower voltage. In some embodiments, one or both circuits 2510 and 2610 are in a signal path of a user design of the IC. In these embodiments, one or both of the circuits 2510 and 2610 receive one or more input signals and supply one or more output signals on the signal path based on the received input signals.

VII. Configurable IC and System

Some embodiments described above are implemented in configurable ICs that can compute configurable combinational digital logic functions on signals that are presented on the inputs of the configurable ICs. In some embodiments, such computations are state-less computations (i.e., do not depend on a previous state of a value).

Some embodiments described above are implemented in configurable ICs that can perform a continuous function. In these embodiments, the configurable IC receives a continuous function at its input and, in response, provides a continuous output at one of its outputs.

Figure 27:
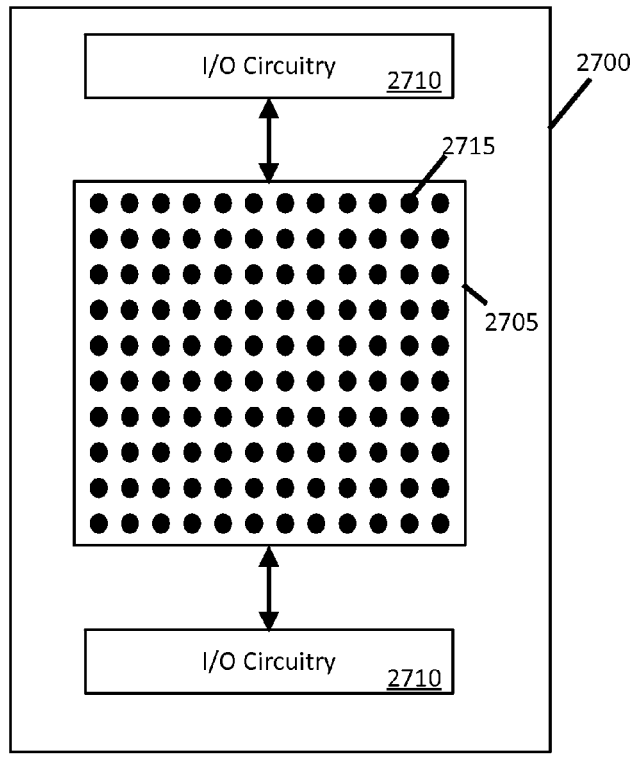
FIGS. 27-31 illustrate different systems in which the IC in accordance with some embodiments may be used.

FIG. 27 illustrates a portion of a configurable IC 2700 of some embodiments of the invention. As shown in this figure, this IC has a configurable circuit arrangement 2705 and I/O circuitry 2710. The configurable circuit arrangement 2705 can be any of the invention's configurable circuit arrangements that were described above. The I/O circuitry 2710 is responsible for routing data between the configurable circuits 2715 of the arrangement 2705 and circuits outside of the arrangement (i.e., circuits outside of the IC, or within the IC but outside of the arrangement 2705). As further described below, such data includes data that needs to be processed or passed along by the configurable circuits.

Figure 28:
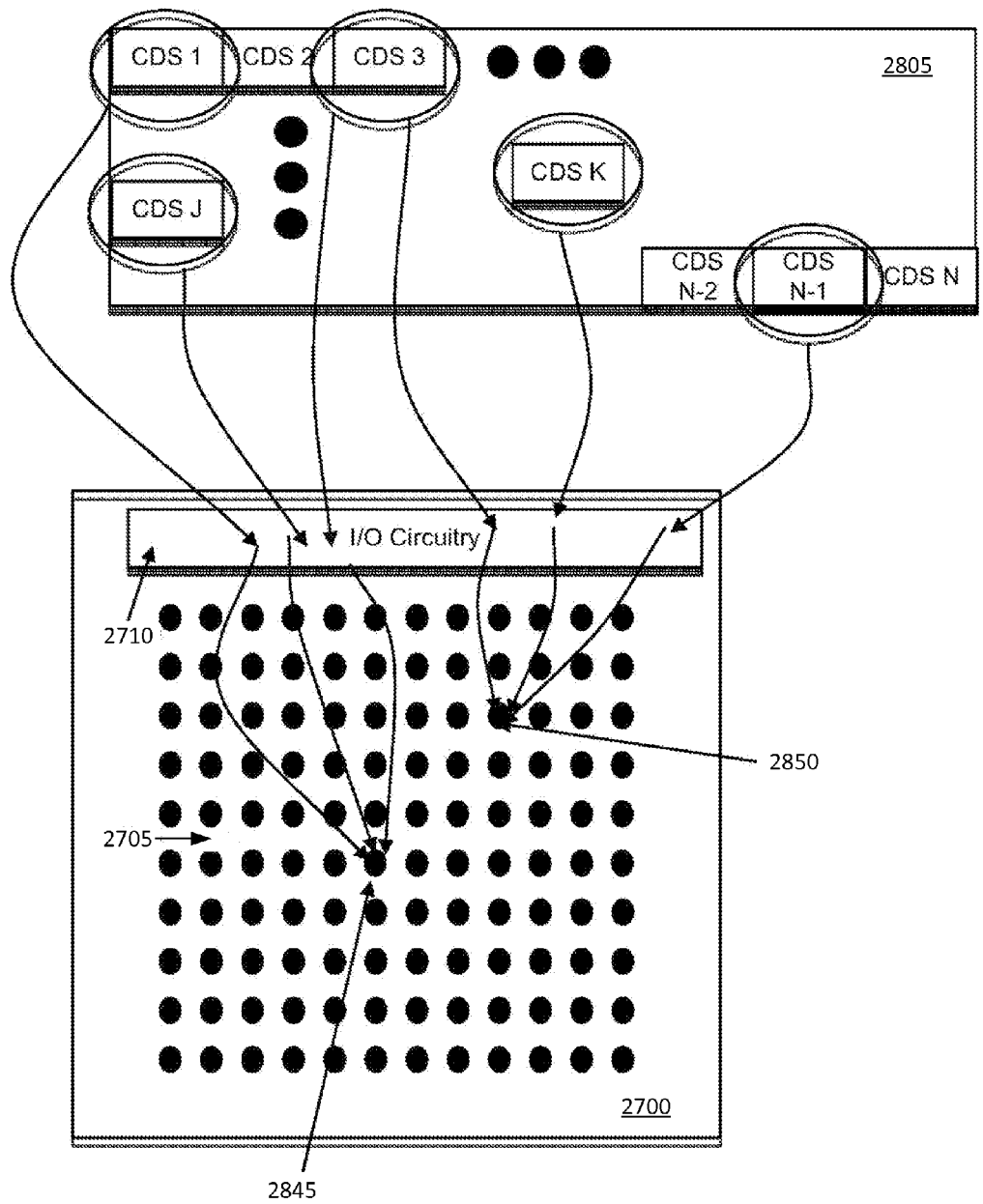

The data also includes, in some embodiments, configuration data that configure the circuits to perform particular operations. FIG. 28 illustrates a more detailed example of this. Specifically, this figure illustrates a configuration data pool 2805 for the configurable IC 2700. This pool includes N configuration data sets ("CDS"). As shown in FIG. 28, the input/output circuitry 2710 of the configurable IC 2800 routes different configuration data sets to different configurable circuits of the IC 2900. For instance, FIG. 28 illustrates configurable circuit 2845 receiving configuration data sets 1, 3, and J through the I/O circuitry, while configurable circuit 2850 receives configuration data sets 3, K, and N-1 through the I/O circuitry. In some embodiments, the configuration data sets are stored within each configurable circuit. Also, in some embodiments, a configurable circuit can store multiple configuration data sets so that it can reconfigure quickly by changing to another configuration data set. In some embodiments, some configurable circuits store only one configuration data set, while other configurable circuits store multiple such data sets.

Figure 29:
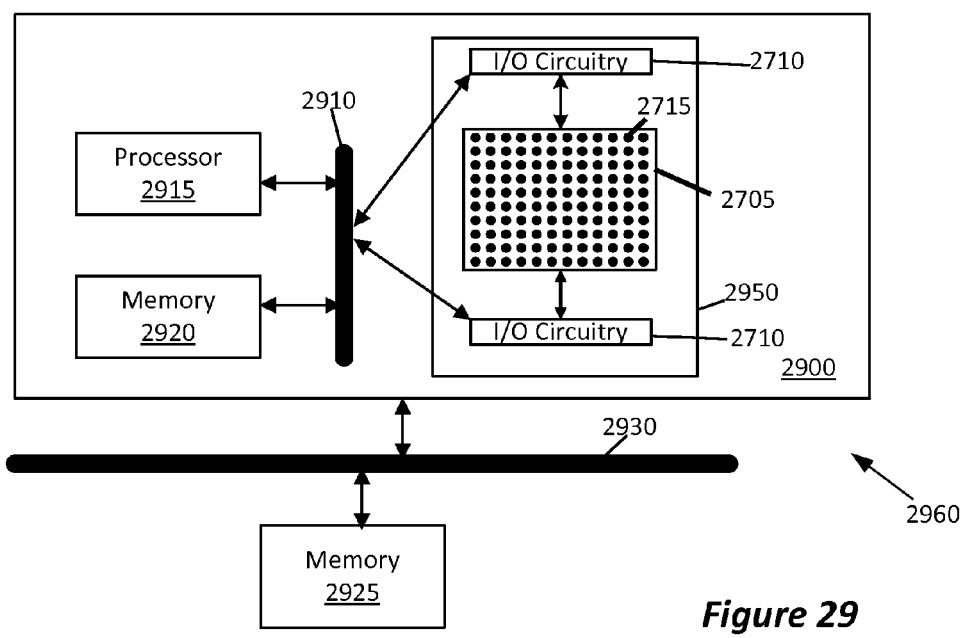

A configurable IC of the invention can also include circuits other than a configurable circuit arrangement and I/O circuitry. For instance, FIG. 29 illustrates a device 2960 which includes a system on chip ("SoC") implementation of a configurable IC 2900, a bus 2930, and an off-chip memory 2925. The IC 2900 has a configurable block 2950, which includes a configurable circuit arrangement 2705 and I/O circuitry 2710 for this arrangement. The IC 2900 also includes a processor 2915 outside of the configurable circuit arrangement 2705, a memory 2920, and a bus 2910. The bus 2910 conceptually represents all conductive paths between the processor 2915, memory 2920, and the configurable block 2950. As shown in FIG. 29, the IC 2900 couples to the bus 2930, which communicatively couples the IC to other circuits, such as the off-chip memory 2925. Bus 2930 conceptually represents all conductive paths between the components of the device 2960.

This processor 2915 can read and write instructions and/or data from an on-chip memory 2920 or an off-chip memory 2925. The processor 2915 can also communicate with the configurable block 2950 through memory 2920 and/or 2925 through buses 2910 and/or 2930. Similarly, the configurable block can retrieve data from and supply data to memories 2920 and 2925 through buses 2910 and 2930.

Figure 30:
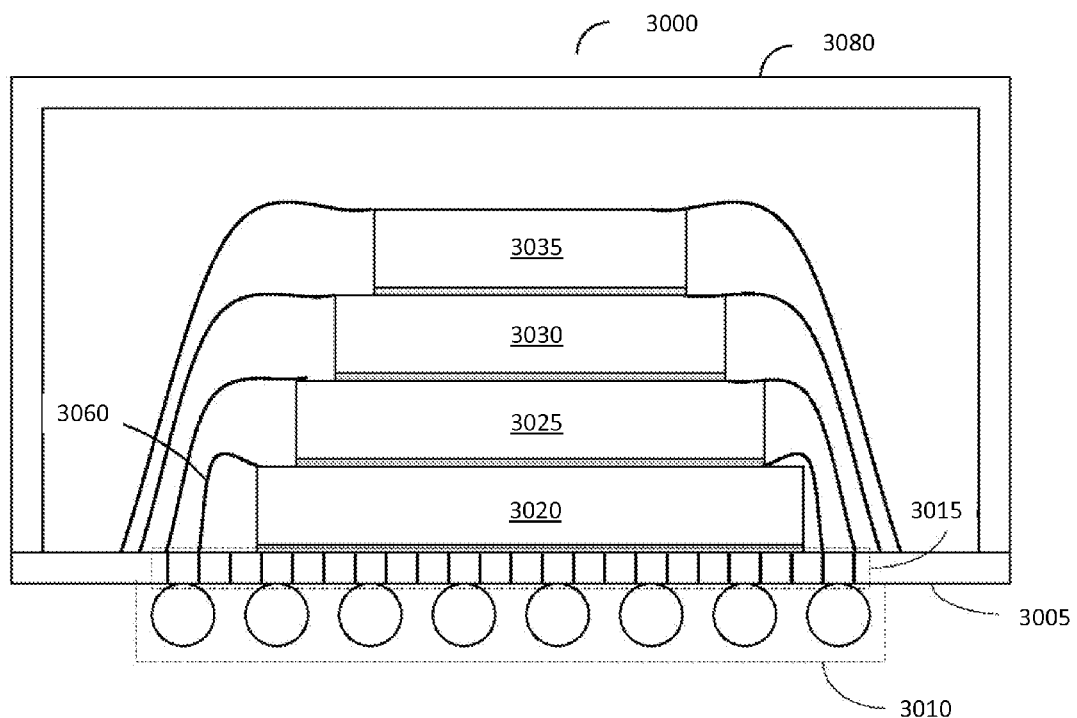

Instead of, or in conjunction with, the system on chip ("SoC") implementation for a configurable IC, some embodiments might employ a system in package ("SiP") implementation for a configurable IC. FIG. 30 illustrates one such SiP 3000. As shown in this figure, SiP 3000 includes four ICs 3020, 3025, 3030, and 3035 that are stacked on top of each other on a substrate 3005. At least one of these ICs is a configurable IC that includes a configurable block, such as the configurable block 2950 of FIG. 29. Other ICs might be other circuits, such as processors, memory, etc.

As shown in FIG. 30, the ICs communicatively connect to the substrate 3005 (e.g., through wire bondings 3060). These wire bondings allow the ICs 3020-3035 to communicate with each other without having to go outside of the SiP 3000. In some embodiments, the ICs 3020-3035 might be directly wire-bonded to each other in order to facilitate communication between these ICs. Instead of, or in conjunction with the wire bondings, some embodiments might use other mechanisms to communicatively couple the ICs 3020-3035 to each other.

As further shown in FIG. 30, the SiP includes a ball grid array ("BGA") 3010 and a set of vias 3015. The BGA 3010 is a set of solder balls that allows the SiP 3000 to be attached to a printed circuit board ("PCB"). Each via connects a solder ball in the BGA 3010 on the bottom of the substrate 3005, to a conductor on the top of the substrate 3005.

The conductors on the top of the substrate 3005 are electrically coupled to the ICs 3020-3035 through the wire bondings. Accordingly, the ICs 3020-3035 can send and receive signals to and from circuits outside of the SiP 3000 through the wire bondings, the conductors on the top of the substrate 3005, the set of vias 3015, and the BGA 3010. Instead of a BGA, other embodiments might employ other structures (e.g., a pin grid array) to connect a SiP to circuits outside of the SiP. As shown in FIG. 30, a housing 3080 encapsulates the substrate 3005, the BGA 3010, the set of vias 3015, the IC's 3020-3035, the wire bondings to form the SiP 3000.

Figure 31:
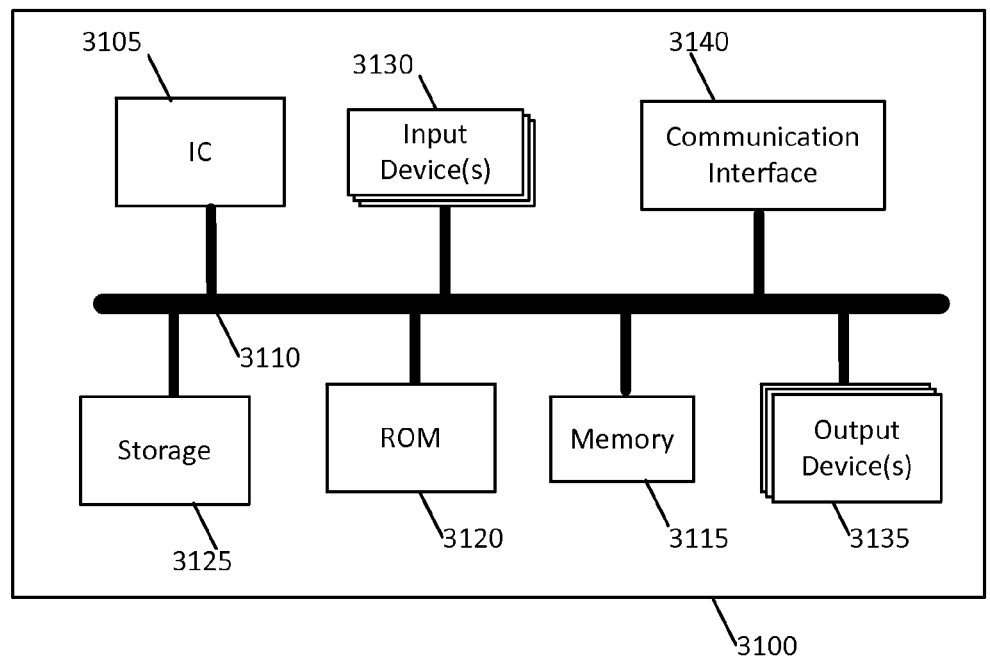

FIG. 31 conceptually illustrates a more detailed example of a computing system 3100 that has an IC 3105, which includes one of the invention's configurable circuit arrangements that were described above. The system 3100 can be a stand-alone computing or communication device, or it can be part of another electronic device. As shown in FIG. 31, the system 3100 not only includes the IC 3105, but also includes a bus 3110, a system memory 3115, a read-only memory 3120, a storage device 3125, input devices 3130, output devices 3135, and communication interface 3140.

The bus 3110 collectively represents all system, peripheral, and chipset interconnects (including bus and non-bus interconnect structures) that communicatively connect the numerous internal devices of the system 3100. For instance, the bus 3110 communicatively connects the IC 3105 with the read-only memory 3120, the system memory 3115, and the permanent storage device 3125.

From these various memory units, the IC 3105 receives data for processing and configuration data for configuring the IC's configurable logic and/or interconnect circuits. When the IC 3105 has a processor, the IC also retrieves from the various memory units instructions to execute. The read-only-memory (ROM) 3120 stores static data and instructions that are needed by the IC 3105 and other modules of the system 3100. The storage device 3125, on the other hand, is read-and-write memory device. This device is a non-volatile memory unit that stores instruction and/or data even when the system 3100 is off. Like the storage device 3125, the system memory 3115 is a read-and-write memory device. However, unlike storage device 3125, the system memory is a volatile read-and-write memory, such as a random access memory. The system memory stores some of the instructions and/or data that the IC needs at runtime.

The bus 3110 also connects to the input and output devices 3130 and 3135. The input devices enable the user to enter information into the system 3100. The input devices 3130 can include touch-sensitive screens, keys, buttons, keyboards, cursor-controllers, microphone, etc. The output devices 3135 display the output of the system 3100.

Finally, as shown in FIG. 31, bus 3110 also couples system 3100 to other devices through a communication interface 3140. Examples of the communication interface include network adapters that connect to a network of computers, or wired or wireless transceivers for communicating with other devices. One of ordinary skill in the art would appreciate that any other system configuration may also be used in conjunction with the invention, and these system configurations might have fewer or additional components.

While the invention has been described with reference to numerous specific details, one of ordinary skill in the art will recognize that the invention can be embodied in other specific forms without departing from the spirit of the invention. For instance, several examples were described above by reference to eight-to-one differential multiplexer. One skilled in the art would recognize that other types of differential circuits may be used in order to benefit from the invention. For instance, a sixteen-to-one differential multiplexer, an eight-input differential LUT, or any other circuit implementing differential signaling may be used. Thus, one of ordinary skill in the art would understand that the invention is not to be limited by the foregoing illustrative details, but rather is to be defined by the appended claims.

We claim:

1. An integrated circuit ("IC") comprising:
   at least first and second circuits comprising a plurality of transistors operating at a first voltage; and
   between the first and second circuits, a direct connection comprising a third circuit for transmitting a signal from the first circuit to the second circuit, wherein the third circuit is a buffer circuit comprising a transistor operating at a second voltage that is lower than the first voltage;
   wherein at least one of the first and second circuits is a configurable circuit for configurably performing operations.

2. The IC of claim 1, wherein the direct connection does not comprise any intervening configurable circuits.

3. The IC of claim 1, wherein the direct connection further comprises a set of buffer circuits for receiving said signal before said third circuit receives said signal, said set of buffer circuits operating at the first voltage.

4. The IC of claim 1, wherein both of the first and second circuits are configurable circuits for configurably performing operations.

5. The IC of claim 1, wherein the configurable circuit is one of a configurable logic circuit for configurably performing logic operations and a configurable interconnect circuit for configurably performing interconnect operations.

6. The IC of claim 1, wherein said buffer circuit is an inverter.

7. The IC of claim 6, wherein said inverter comprises two NMOS transistors.

8. The IC of claim 1, wherein at least one of the first and second circuits implements a logical signal as two complementary physical signals.

9. The IC of claim 1, wherein the direct connection is at least partly implemented by differential signaling.

10. The IC of claim 1, wherein said buffer circuit outputs a signal at the second voltage.

11. The IC of claim 1, wherein said second circuit comprises a sub-circuit for level converting the signal from the second voltage to the first voltage.

12. The IC of claim 11, wherein said sub-circuit comprises a set of cross-coupled transistors.

13. An integrated circuit ("IC") comprising:
at least first and second circuits operating at a first voltage;
between the first and second circuits, a direct connection comprising a third circuit for transmitting a signal from the first circuit to the second circuit at a second voltage that is lower than the first voltage,
wherein the first circuit is a configurable circuit for configurably performing operations and said second circuit is a repeater for receiving said signal at a first current drive and for outputting said signal at a second current drive that is stronger than said first current drive.

14. An integrated circuit ("IC") comprising:
first and second circuits operating at a first voltage; and
between said first and second circuits, a direct connection for carrying a logical value from the first circuit to the second circuit, said direct connection at least partly implementing differential signaling, said direct connection comprising:
first and second lines for carrying complementary first and second physical values that together represent the logical value,
wherein the first line comprises a first buffer for outputting the first physical value to the second circuit, the first buffer operating at a second voltage that is lower than the first voltage,
wherein the second line comprises a second buffer for outputting the second physical value to the second circuit, the second buffer operating at said second voltage.

15. The IC of claim 14, wherein the first and second buffers are inverters.

16. The IC of claim 14, wherein at least one of the first and second circuits is a configurable circuit.

17. The IC of claim 14, wherein the first buffer outputs the first physical value at the second voltage.

18. The IC of claim 14, wherein the second buffer outputs the second physical value at the second voltage.

19. The IC of claim 14, wherein said first and second buffers each comprise two NMOS transistors.

* * * * *